(12) United States Patent
Gupta et al.

(10) Patent No.: US 12,057,854 B2
(45) Date of Patent: Aug. 6, 2024

(54) HIGH ORDER NONLINEARITY ESTIMATION OF RADIOFREQUENCY ANALOG-TO-DIGITAL CONVERTERS

(71) Applicant: Texas Instruments Incorporated, Dallas, TX (US)

(72) Inventors: Pankaj Gupta, Dausa (IN); Ajai Paulose, Idukki (IN); Sreenath Narayanan Potty, Bangalore (IN); Divyansh Jain, Mumbai (IN); Jaiganesh Balakrishnan, Bangalore (IN); Jawaharlal Tangudu, Bangalore (IN); Aswath VS, Kannur (IN); Girish Nadiger, Bengaluru (IN); Ankur Jain, Ghaziabad (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/682,753

(22) Filed: Feb. 28, 2022

(65) Prior Publication Data
US 2023/0275594 A1    Aug. 31, 2023

(51) Int. Cl.
*H03M 1/06*    (2006.01)
(52) U.S. Cl.
CPC ............................. *H03M 1/0617* (2013.01)
(58) Field of Classification Search
CPC ................................................. H03M 1/1067
USPC ........................................ 341/118, 120, 155
See application file for complete search history.

(56) References Cited

U.S. PATENT DOCUMENTS

| | | | |
|---|---|---|---|
| 7,330,141 B2* | 2/2008 | Temerinac | H03M 1/1042 341/120 |
| 8,825,415 B2* | 9/2014 | Johansson | H03M 1/0626 702/58 |
| 9,935,645 B1* | 4/2018 | Tangudu | H03M 1/0836 |
| 10,284,188 B1 | 5/2019 | Soundararajan et al. | |
| 10,673,452 B1 | 6/2020 | Soundararajan et al. | |
| 10,673,453 B1 | 6/2020 | Pentakota et al. | |
| 10,673,456 B1 | 6/2020 | Dusad et al. | |
| 2010/0315275 A1* | 12/2010 | Murahashi | H03F 3/2173 341/143 |
| 2016/0211856 A1* | 7/2016 | Muhammad | H03M 1/1255 |
| 2017/0324421 A1* | 11/2017 | Tangudu | H03M 1/1009 |
| 2021/0105019 A1* | 4/2021 | Gupta | H03M 1/1033 |

* cited by examiner

*Primary Examiner* — Peguy Jean Pierre
(74) *Attorney, Agent, or Firm* — John R. Pessetto; Frank D. Cimino

(57) ABSTRACT

An example apparatus includes: nonlinearity function selection circuitry with an output, the nonlinearity function selection circuitry to select a type of a nonlinearity function, the nonlinearity function to model nonlinearity portions of data output from an analog-to-digital converter, nonlinearity function term generation circuitry with a first input coupled to the output, the nonlinearity function term generation circuitry to generate one or more nonlinearity function terms of the nonlinearity function based on the type of the nonlinearity function and the data, and coefficient determination circuitry with a second input coupled to the output, the coefficient determination circuitry to determine one or more nonlinearity function coefficients based on the one or more nonlinearity function terms, the nonlinearity portions of the data to be compensated based on the one or more nonlinearity function coefficients.

16 Claims, 7 Drawing Sheets

1

HIGH ORDER NONLINEARITY ESTIMATION OF RADIOFREQUENCY ANALOG-TO-DIGITAL CONVERTERS

TECHNICAL FIELD

This description relates generally to nonlinearity estimation, and more particularly to high order nonlinearity estimation of radiofrequency analog-to-digital converters.

BACKGROUND

Electronic systems, such as audio and video equipment, a mobile phone, measurement equipment, a radar system, a wireline communication system, etc., may include one or more circuits or components whose operation is nonlinear. The nonlinearity circuits or components may adversely impact performance of the electronic system. One such nonlinearity circuit or component is an analog-to-digital converter (ADC), which converts a continuous-time analog signal (such as a current or voltage) into a discrete time representation (such as a digital or digitized signal) that is proportional in magnitude to the continuous-time analog signal. Compensation for nonlinearity introduced into an electronic system by a nonlinearity circuit or component, such as an ADC, is desired.

SUMMARY

For high order nonlinearity estimation of radiofrequency analog-to-digital converters, an example apparatus includes nonlinearity function selection circuitry with an output, the nonlinearity function selection circuitry to select a type of a nonlinearity function, the nonlinearity function to model nonlinearity portions of data output from an analog-to-digital converter, nonlinearity function term generation circuitry with a first input coupled to the output, the nonlinearity function term generation circuitry to generate one or more nonlinearity function terms of the nonlinearity function based on the type of the nonlinearity function and the data, and coefficient determination circuitry with a second input coupled to the output, the coefficient determination circuitry to determine one or more nonlinearity function coefficients based on the one or more nonlinearity function terms, the nonlinearity portions of the data to be compensated based on the one or more nonlinearity function coefficients.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
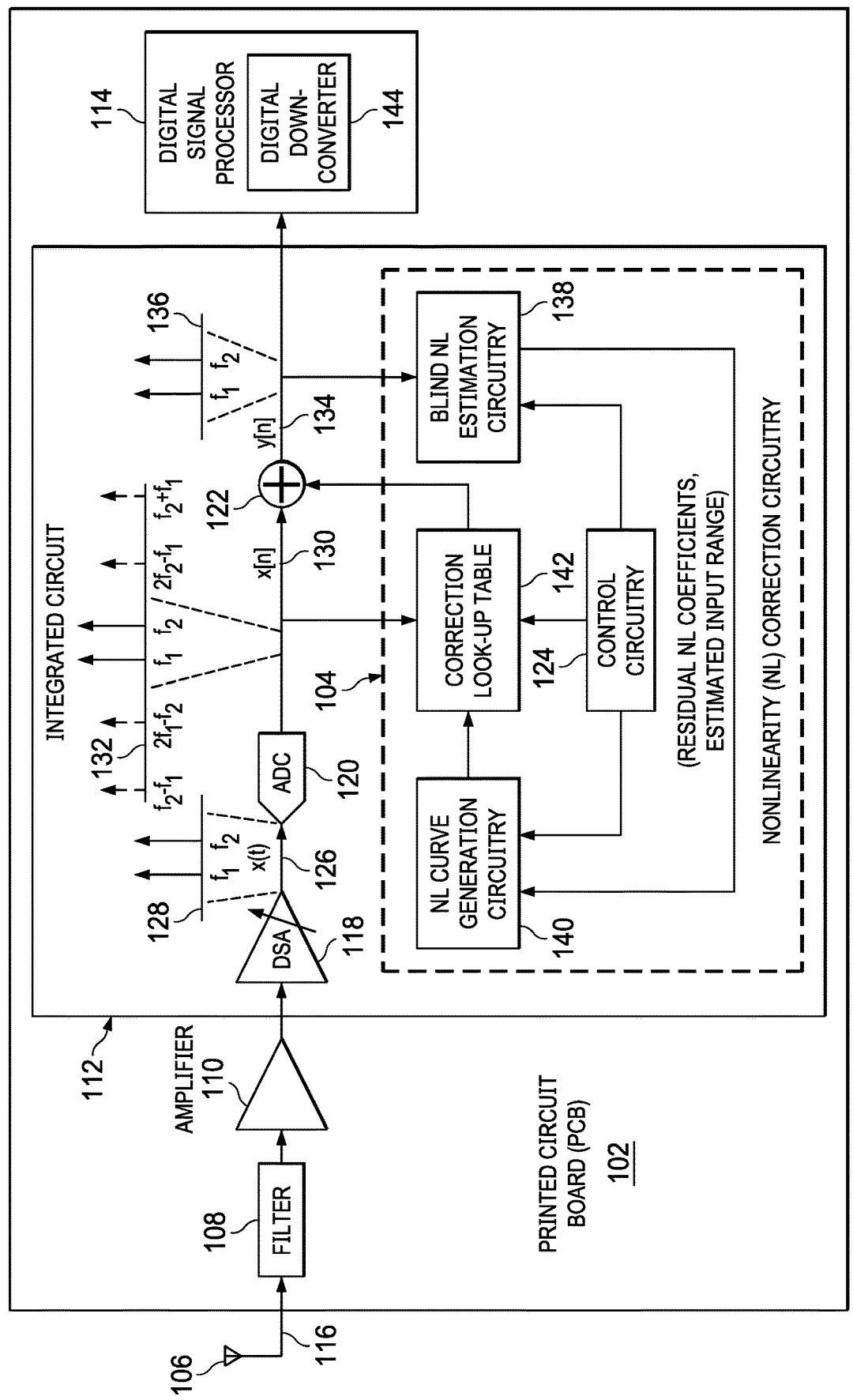
FIG. 1 is a schematic diagram of an example system including an example printed circuit board, which includes example blind nonlinearity estimation circuitry to compensate for nonlinearity of the system.

The drawings are not necessarily to scale.

Electronic systems, such as audio and video equipment, a mobile phone, measurement equipment, a radar system, a wireline communication system, etc., utilize analog-to-digital converters (ADCs). For example, the wireless infrastructure (WI) market (e.g., the wireless basestation market) is moving towards radiofrequency-ADC (RF-ADC) based sampling architectures because the RF-ADC easily supports multiple frequency bands and a wider bandwidth with reduced area (such as reduced board area, printed circuit board area, etc.). Such electronic systems supporting multiple sampling rates (such as sampling rates of 2.5 gigasamples per second (GSPS), 3GSPS, 4GSPS, etc.) may utilize a pipeline architecture based ADC. However, pipeline architecture ADCs are typically expensive in terms of area and power. Low-area ADC architectures have evolved to address the limitations of such pipeline architectures.

An example of a low-area ADC architecture is a delay-based ADC architecture, which is inherently nonlinear. Examples of delay-based ADC architectures are provided in U.S. Pat. Nos. 10,284,188, 10,673,452, 10,673,453, and 10,673,456 and U.S. patent application Ser. Nos. 17/182,339, 17/129,180, 17/131,981, 17/133,745, and 17/588,493 (all of which are incorporated by reference in their entirety). Nonlinearity estimation and correction techniques may be used to compensate (such as cause compensation to occur) for residual nonlinearity from such architectures. During run-time, ADCs in delay-based ADC architectures are periodically calibrated (such as every 100 milliseconds (ms)) using a calibration path (such as a path including calibration circuitry and the ADC). Although the periodic calibration may correct a portion of the nonlinearity of the ADC, there may still be a mismatch between the calibration path and the primary path, which would not be corrected by this calibration. The mismatch may appear as residual nonlinearity in a device (such as an integrated circuit (IC) or a semiconductor chip), and/or, more generally, an electronic system that includes the device.

Some nonlinearity correction techniques may not enable an electronic system to meet target performance specifications. For instance, RF-ADC nonlinearity performance metrics of interest include second- and third-order harmonic distortion and second- and third-order intermodulation distortion. An example target spurious-free dynamic range (SFDR) specification is −80 decibels relative to full scale (dBFS) across various RF receiver operating scenarios, such as across various input levels, Nyquist zones (such as frequencies), and temperature ranges (such as a temperature range of −40 degrees Celsius (C) to 125 C). However, a target SFDR of −80 dBFS is challenging when the noncorrected output signal level from an ADC is −55 dBFS, which occurs in some applications.

Additionally, there may be nonlinearity caused by external (e.g., circuitry connected to the ADC, such as other circuits on the same semiconductor substrate or the same printed circuit board (PCB)) circuitry (such as second order nonlinearity) and nonlinearity due to temperature variations, voltage variations, and/or aging effects. This linearity, if not corrected, may increase difficulty of meeting target performance specifications. Moreover, it is desired that nonlinearity caused by the ADC (and other circuitry residing on a PCB or chip with the ADC, for instance) and nonlinearity caused by board circuitry and other effects within the electronic system, is corrected without correcting source nonlinearity. For example, source nonlinearity may be caused by RF power amplifier circuitry and digital pre-distortion circuitry of a transmitter.

A technique to correct or compensate for nonlinearity in a system (such as an electronic system) includes applying factory-calibrated nonlinearity correction to a digital signal output from an ADC. During production of such systems, nonlinearity correction terms are determined for a range of sampling rates, Nyquist zones, and digital step attenuator (DSA) indexes, and stored in memory. During runtime, appropriate nonlinearity correction coefficients are identified based on receiver configuration and recalled from memory. However, this approach has some limitations, such as the time needed to perform the in-factory calibration and the memory needed to store the correction coefficients. Such limitations increase device cost. For example, an ADC may be used to support multiple sampling rates (such as 2.5 GSPS, 3GSPS, 4GSPS, etc.) and correction coefficients are stored in memory for all of the supported sampling rates, which increases device cost due to increased memory requirements. Yet another limitation is that other nonlinearity sources, such as second order nonlinearity caused by the board on which the ADC is mounted, changes due to temperature, voltage, and/or aging, etc., are not accounted for by factory calibration.

Another technique to correct or compensate for nonlinearity in a system includes estimating nonlinearity correction terms by supplying raw time domain samples from an ADC to a nonlinearity estimator module. In some instances, the nonlinearity estimator module may fit a multi-tap Volterra and derivative term based model (such as a model based on nonlinearity polynomial functions) with the raw samples from the ADC. The nonlinearity estimator module may determine a nonlinearity coefficient or weight for each term in the model. However, this approach has some limitations. For example, a Volterra-series based nonlinearity estimator module compensates for nonlinearity associated with an amplifier, which is compressive in nature, rather than nonlinearity associated with an ADC, which is not compressive in nature. Additionally, coefficient/weight estimation for nonlinearity polynomial functions of a Volterra-series based model is difficult at lower input levels (such as an input level at −5 dBFS, −10 dBFS, etc.). For example, the respective powers of these nonlinearity polynomial functions (such as a nonlinearity function with an $x(n)^k$ term) die down and/or otherwise reduce rapidly, which require substantially larger precision in hardware to represent the powers.

Systems, methods, apparatus, and articles of manufacture for high order nonlinearity estimation of RF-ADCs are described. Examples described herein include a blind nonlinearity estimator that utilizes an online blind ADC nonlinearity estimation technique (such as an integral nonlinearity (INL) estimation technique). The blind nonlinearity estimator can use the online blind ADC nonlinearity estimation technique to adaptively estimate residual ADC nonlinearity and track the variation(s) thereof over time. In some described examples, the blind nonlinearity estimator can be implemented by blind nonlinearity estimation circuitry using hardware (e.g., a processor, microcontroller, microcomputer, digital circuitry, memory, state machine, application specific integrated circuit (ASIC), and/or field programmable gate array (FPGA)), software, and/or firmware.

In some described examples, the nonlinearity estimation technique is an online (i.e., during operation) technique because the blind nonlinearity estimator can perform the technique while the ADC is operating in a real-world application (such as receiving radiofrequency data from an antenna or antenna circuitry) and/or otherwise processing live data. In some described examples, the nonlinearity estimation technique is a blind technique because the blind nonlinearity estimator can be unaware of the quality of the input data provided to the ADC. For example, the nonlinearity estimation technique is a blind technique because the blind nonlinearity estimator can be "blind" and/or otherwise unaware of the quality of the input data provided to the ADC.

In some described examples, a nonlinearity curve generator, which can be implemented by nonlinearity curve generation circuitry using hardware (e.g., a processor, microcontroller, microcomputer, digital circuitry, memory, state machine, ASIC, and/or FPGA), software, and/or firmware, can utilize nonlinearity functions to model nonlinearity of the ADC. For example, the nonlinearity functions can model nonlinearity portions of output data from the ADC. The nonlinearity portions of output data from the ADC can be and/or otherwise be representative of a residual mismatch between a main/primary path of the ADC and a calibration path of the ADC. The nonlinearity functions can include nonlinearity terms (such as nonlinearity function terms), which may be adjusted by coefficients or weights (such as nonlinearity function coefficients, nonlinearity function weights, etc.). For example, the nonlinearity curve generator can generate (such as by estimating) a curve (such as a mathematical curve, plot, graphical representation, etc.), which models the ADC nonlinearity using output data from the ADC. The nonlinearity curve generator can generate the curve based on the nonlinearity terms, the nonlinearity coefficients, the nonlinearity functions, etc.

In some described examples, the nonlinearity curve generator can generate the curve using INL estimation. For example, the curve can be an INL curve that models ADC nonlinearity. INL is a measure of the deviation between the ideal output value of an ADC for a specified input code and the actual measured output value of the ADC for the specified code. For example, INL can be the deviation of the values on the actual transfer function of the ADC from a straight line.

In some described examples, the nonlinearity curve generator can generate terms (such as correction terms) based on the curve and store the terms in a look-up table. The look-up table can map ADC output data to a correction term in the look-up table. The look-up table can adjust the ADC output data with the correction term to generate corrected ADC output data. The corrected ADC output data may be provided to other circuitry, such as a digital signal processor.

In some described examples, the blind nonlinearity estimator can refine a previous estimate of the curve by the nonlinearity curve generator based on the corrected ADC output data. The blind nonlinearity estimator can refine the previous estimate using the online blind ADC nonlinearity estimation technique. For example, the blind nonlinearity estimator can receive the corrected ADC output data and determine residual nonlinearity of the ADC based on the corrected ADC output data. The blind nonlinearity estimator can select a type of function to model ADC nonlinearity (such as ADC residual nonlinearity). For example, the function can be a sinusoid function, a cosinusoid function, a periodic triangular pulse function, or a periodic rectangular pulse function with different periodicities. In some described examples, the function can exhibit either odd symmetry or even symmetry (such as the function exhibits odd symmetry, the function exhibits even symmetry, etc.). The blind nonlinearity estimator can determine nonlinearity function terms of the function. The nonlinearity function terms can correspond to components or portions of the corrected ADC output data that are nonlinear. The blind nonlinearity estimator can convert linear term(s) of the corrected ADC output data and the nonlinearity function terms from a time domain representation to a frequency domain representation. The blind nonlinearity estimator can select relevant frequency bins associated with the linear term(s) and/or the one or more nonlinearity function terms in the frequency domain representation. The blind nonlinearity estimator can estimate nonlinearity function coefficient(s) (such as residual nonlinearity coefficient(s)) to be applied to the function by using the linear term(s) and/or the nonlinearity terms that fall in the relevant frequency bins.

In some described examples, the blind nonlinearity estimator refines the previous estimate of the curve by the nonlinearity curve generator based on the estimated nonlinearity function coefficient(s) and/or a receive (RX) input signal level (such as a range of amplitudes, an envelope of amplitudes, etc.) associated with the ADC output data. For example, the nonlinearity curve generator can model ADC nonlinearity using a first curve (such as a first nonlinearity correction curve) based on a nonlinearity function; the blind nonlinearity estimator can estimate the nonlinearity function coefficient(s) for the nonlinearity function and/or the RX input signal level; and the blind nonlinearity estimator can model residual nonlinearity of the ADC using a second curve (such as a second nonlinearity correction curve) based on the nonlinearity function using the estimated nonlinearity function coefficient(s) and/or the RX input signal level. The residual nonlinearity can be representative of nonlinearity associated with the ADC that remains after and/or in response to the look-up table applying correction terms to ADC output data to generate corrected ADC output data.

By way of example, if the blind nonlinearity estimator determines that the RX input signal level is in a range of [−0.5, 0.5], then the blind nonlinearity estimator can form the nonlinearity correction curve in the same range using finite step-sizes or discrete points. Advantageously, the blind nonlinearity estimator can determine the RX input signal level to identify a valid range in which to regenerate the second curve (or generate the first curve) and thusly determine new or updated nonlinearity function coefficients for the valid range. The nonlinearity curve generator can regenerate the first curve based on the new or updated nonlinearity function coefficients. The nonlinearity curve generator can determine new or updated correction terms based on the regenerated first curve and store the new or updated correction terms in the look-up table. Advantageously, the nonlinearity curve generator can correct the ADC output data based on the new or updated correction terms to generate corrected ADC output data. Advantageously, examples described herein can generate the corrected ADC output data for improved accuracy and performance of electronic systems that support multi-band, wide bandwidth, and/or reduced area ADC architectures.

FIG. 1 is a schematic diagram of an example system 100 including an example printed circuit board (PCB) 102, which includes example nonlinearity correction circuitry 104 to compensate for nonlinearity of the system 100 and/or component(s) thereof. For example, the nonlinearity correction circuitry 104 can be and/or otherwise implement a nonlinearity corrector. In some examples, the system 100 is included in receiver circuitry (such as part of a receiver, a transceiver, etc.) of an electronic system such as audio and video equipment, measurement equipment, a mobile phone, a radar system, a radio access network (RAN) device, a wireline communication system, etc. In alternative embodiments, additional features may be included in the IC 112 (such as the filter 108, the amplifier 110 and/or the digital signal processor 114). Alternatively, fewer features may be included in the IC 112.

The system 100 includes an example antenna 106 coupled to the PCB 102. The PCB 102 includes an example filter 108, an example amplifier 110, an example integrated circuit (IC) 112, and an example digital signal processor (DSP) 114. For example, the antenna 106 and the PCB 102 can be separate components that are configured to be coupled together (such as the antenna 106 is configured to be mounted onto the PCB 102). In some examples, the antenna 106 and the PCB 102 can be combined into a single device or package. In some examples, the filter 108, the amplifier 110, the IC 112, and the DSP 114 can be separate components that are configured to be coupled to one(s) of each other. For example, the filter 108, the amplifier 110, the IC 112, and/or the DSP 114 can be mounted onto the PCB 102. In some examples, the filter 108, the amplifier 110, the IC 112, and/or the DSP 114 can be combined into a single device or package.

In some examples, the filter 108 is a band-select filter (such as a band-pass filter), which can limit a bandwidth of an example radiofrequency (RF) signal 116 received by the antenna 106. The RF signal 116 is an analog signal. For example, the RF signal 116 can include linear component(s) (such as linear signal component(s)) and source nonlinearity component(s) (such as second order nonlinearity signal component(s), third order nonlinearity signal component(s), etc.). In some examples, the filter 108 can filter out all or portion(s) of the second order nonlinearity components and far-off third order nonlinearity components. In some examples, the amplifier 110 is a low-noise amplifier (LNA), which can amplify signals of relatively low strength (such as the RF signal 116) without significantly degrading the signal-to-noise ratio (SNR) of the signals. In some examples, the placement of the amplifier 110 and the filter 108 are reversed, and, in other examples, the filter 108 and the amplifier 110 may be implemented in a single device.

In the illustrated example, output(s) of the antenna 106 is/are coupled to input(s) of the filter 108. Output(s) of the filter 108 is/are coupled to input(s) of the amplifier 110. Output(s) of the amplifier 110 is/are coupled to input(s) of the IC 112. In example operation, the antenna 106 can receive the RF signal 116 (such as from a transmitter, a transceiver, etc., associated with another electronic system or device); the filter 108 can filter the RF signal 116 to generate a filtered RF signal; the amplifier 110 can amplify the filtered RF signal to generate an amplified, filtered RF signal; and the amplifier 110 can provide the amplified, filtered RF signal to the IC 112 for further processing. In some examples, the antenna 106, the filter 108, and/or the amplifier 110 are implemented as circuitry in hardware.

In some examples, the IC 112 is a chip implemented in a single package (e.g., a semiconductor package of a single semiconductor die or a multi-chip module (MCM) package incorporating one or more semiconductor die). Alternatively, the IC 112 may be implemented by one or more ICs, one or more chips, and/or one or more packages. In this example, the IC 112 includes the nonlinearity correction circuitry 104, an example digital step attenuator (DSA) 118, an example analog-to-digital converter (ADC) 120, and example adder circuitry 122. In this example, output(s) of the DSA 118 is/are coupled to input(s) of the ADC 120. Output(s) of the ADC 120 is/are coupled to input(s) of the nonlinearity correction circuitry 104 and input(s) of the adder circuitry 122. Output(s) of the adder circuitry 122 is/are coupled to input(s) of the nonlinearity correction circuitry 104 and input(s) of the DSP 114.

In example operation, the DSA 118 receives the filtered, amplified analog data signal (e.g., one or more carrier signals modulated to carry the data) from the amplifier 110. The DSA 118 can attenuate the signal from the amplifier 110 by an attenuation value that is selectable by a digital value provided to the DSA 118, for instance by example control circuitry 124. The DSA 118 can output an example analog data signal 126 (identified by x(t)), which is represented by a first example spectral plot 128 (described in more detail below). An analog data signal may also be referred to herein interchangeably as analog data or simply data. In this example, the ADC 120 is an RF-ADC. Alternatively, the ADC 120 may be any other type of ADC. The ADC 120 of the illustrated example can digitize the analog data signal 126 to generate an example digital data signal 130 (identified by x[n]). The digital data signal 130 is represented by a second example spectral plot 132. In this example, the digital data signal 130 is an uncorrected digital signal. A digital data signal may also be referred to herein interchangeably as an uncorrected digitized signal, digital data, digitized data, or simply data. In the illustrated example, the second spectral plot 132 depicts nonlinearity introduced by the ADC 120.

In example operation, the ADC 120 outputs the digital data signal 130 to the nonlinearity correction circuitry 104 and the adder circuitry 122. The nonlinearity correction circuitry 104 can output an INL curve output (such as a correction term, an ADC data correction term, etc.) to the adder circuitry 122. The adder circuitry 122 can generate an example corrected digital data signal 134 (identified by y[n]), which is represented by a third example spectral plot 136. A corrected digital data signal may also be referred to herein interchangeably as a corrected digital signal, corrected digital data, corrected digitized data, or simply corrected data. The adder circuitry 122 can output the corrected digital data signal 134 to the DSP 114 for further processing.

The first spectral plot 128, the second spectral plot 132, and the third spectral plot 136 are frequency domain representations of respective ones of the analog data signal 126, the digital data signal 130, and the corrected digital data signal 134 at various stages of processing within the system 100. The analog data signal 126 is a processed version of the RF signal 116, which is an analog signal received by the antenna 106. The analog data signal 126 is a two-tone signal with fundamental or carrier frequencies $f_1$ and $f_2$ as illustrated by the first spectral plot 128. For example, the RF signal 116 and the analog data signal 126 are RF signals and the frequencies $f_1$ and $f_2$ are within the radio spectrum. Additionally and/or alternatively, the analog data signal 126 may include a single tone or more than two tones. In some examples, the analog data signal 126 can be orthogonal frequency-division multiplexing (OFDM) data or representative of any other random signal.

In the illustrated example, the ADC 120 introduces second order nonlinearity components at DC and at frequencies $f_2-f_1$, $2f_2$, $2f_1$, and $f_2+f_1$; and "close-in" third order nonlinearity components at frequencies $2f_1-f_2$ and $2f_2-f_1$, which are closer to the fundamental frequencies. Additionally or alternatively, any other number and/or types of nonlinearity components may be associated with the digital data signal 130 (such as "far-off" third order nonlinearity components at $2f_1+f_2$, $3f_1$, $3f_2$, and $f_1+2f_2$, which are further from the fundamental frequencies). For example, the second and third order nonlinearity components can be caused by nonlinearity in the circuitry of the ADC 120 or circuitry associated with the ADC 120 (such as PCB interconnects, traces, vias, and the like). Although the second spectral plot 132 of the illustrated example depicts nonlinearity of the second and third order, alternatively the second spectral plot 132 may include higher order nonlinearity terms (such as up to tenth order or twentieth order, etc.).

Advantageously, the nonlinearity correction circuitry 104 operates to correct (such as remove, mitigate, or compensate for) these nonlinearity components in the digital data signal 130. For example, the nonlinearity correction circuitry 104 can provide INL curve outputs (e.g., one or more correction terms) to the adder circuitry 122 that, when applied to the digital data signal 130, can remove the second, third, and/or higher order nonlinearity components from the digital data signal 130 as depicted in the third spectral plot 136.

The nonlinearity correction circuitry 104 includes the control circuitry 124, example blind nonlinearity estimation circuitry 138, example nonlinearity curve generation circuitry 140, and an example correction look-up table 142. In some examples, the control circuitry 124, the blind nonlinearity estimation circuitry 138, the nonlinearity curve generation circuitry 140, and/or the correction look-up table 142 are implemented as circuitry in hardware (such as one or more logic circuits, a hardware-implemented state machine, etc.) and/or firmware, and/or implemented by processor circuitry executing instructions stored in memory. For example, the processor circuitry can be a microprocessor or microcontroller, which may be the same as or different from the control circuitry 124. In some examples, the control circuitry 124 can be a microcontroller that controls the timing of digital processes performed and/or otherwise carried out by the blind nonlinearity estimation circuitry 138, the nonlinearity curve generation circuitry 140, and/or the correction look-up table 142. In some examples, the control circuitry 124 can generate, provide, and/or otherwise output control signals, such as DSA indices or values or control flags to circuitry in the nonlinearity correction circuitry 104 and/or the IC 112. In some examples, the correction look-up table 142 is memory (such as volatile memory, nonvolatile memory, etc.) or any other type of storage device or component. Additionally and/or alternatively, the correction look-up table 142 may be implemented with combinatorial logic, firmware executed by a controller, etc.

In the illustrated example, output(s) of the adder circuitry 122 is/are coupled to input(s) of the blind nonlinearity estimation circuitry 138. Output(s) of the blind nonlinearity estimation circuitry 138 is/are coupled to input(s) of the nonlinearity curve generation circuitry 140. Output(s) of the nonlinearity curve generation circuitry 140 is/are coupled to input(s) of the correction look-up table 142. Input(s) of the correction look-up table 142 is/are coupled to output(s) of the ADC 120. Output(s) of the correction look-up table 142 is/are coupled to input(s) of the adder circuitry 122. Output(s) of the control circuitry 124 is/are coupled to input(s) of the blind nonlinearity estimation circuitry 138, the nonlinearity curve generation circuitry 140, and the correction look-up table 142. Input(s) and/or output(s) of the control circuitry 124 can be coupled to respective output(s) and/or input(s) of any other circuitry in the nonlinearity correction circuitry 104 (such as circuitry not shown) and/or circuitry of the IC 112, such as the DSA 118, the ADC 120, the adder circuitry 122, etc.

In example operation, the nonlinearity curve generation circuitry 140 generates (such as by estimation) nonlinearity correction terms (or simply referred to as correction terms or values) for given sampling rates, Nyquist zones, DSA settings, etc., at which the ADC 120 operates. The nonlinearity curve generation circuitry 140 outputs the correction terms to the correction look-up table 142. For example, the nonlinearity curve generation circuitry 140 can write and/or otherwise record the correction terms in the correction look-up table 142. The correction look-up table 142 can store associations between the correction terms and ADC digital output codes. For example, the Nyquist zone (or parameter) of the ADC 120 is determined when the ADC 120 is powered on. The nonlinearity curve generation circuitry 140 can write the correction terms for each of the possible ADC digital output codes for the Nyquist zone in which the ADC 120 is operating. For example, the correction look-up table 142 can store associations between ADC digital output codes (such as a digital output code of '010' that may correspond to the digital data signal 130) and respective correction terms for a specific Nyquist zone. In some examples, the correction look-up table 142 can store multiple associated ones of the ADC digital output codes to the same correction term to reduce a storage size of the correction look-up table. For example, a number of consecutive ADC digital output codes can be associated with, mapped to, etc., the same correction term if values of the correction terms for these ADC digital output codes are the same or are substantially similar.

In example operation, the correction look-up table 142 can identify a digital output code based on the digital data signal 130; map the digital output code to a correction term in the correction look-up table 142; and output the correction term to the adder circuitry 122. The adder circuitry 122 can add and/or otherwise apply the correction term to the digital data signal 130 to generate the corrected digital data signal 134. Advantageously, the adder circuitry 122 can use or apply the correction term from the correction look-up table 142, and/or, more generally, the nonlinearity correction circuitry 104, to correct the nonlinearity components in the digital data signal 130, which were caused by nonlinearity of the ADC 120.

In example operation, the nonlinearity curve generation circuitry 140 can generate the correction term responsive to generating a nonlinearity curve. For example, the nonlinearity curve generation circuitry 140 can employ a nonlinearity function to model nonlinearity of the ADC. The nonlinearity function can include nonlinearity terms (such as nonlinearity function terms), which may be adjusted by nonlinearity function coefficients or weights. The nonlinearity curve generation circuitry 140 can generate (such as by estimating) a curve (such as an integral nonlinearity (INL) curve or any other estimation curve), which models the ADC nonlinearity, by using the nonlinearity terms. In some examples, the nonlinearity curve generation circuitry 140 and the blind nonlinearity estimation circuitry 138 utilize the same nonlinearity function, which can be selected by the control circuitry 124. In some examples, the nonlinearity curve generation circuitry 140 can utilize a portion or subset of the nonlinearity function utilized by the blind nonlinearity estimation circuitry 138.

By way of distinction, nonlinearity function terms are (i) used by the nonlinearity curve generation circuitry 140 to model nonlinearity components in a signal (such as the digital data signal 130) using a nonlinearity function and/or (ii) used by the blind nonlinearity estimation circuitry 138 to model residual nonlinearity components in a signal (such as the corrected digital data signal 134, etc.) using a nonlinearity function. The blind nonlinearity estimation circuitry 138 can determine (such as by estimating) nonlinearity function coefficients of the nonlinearity function based on the nonlinearity function terms.

By contrast, correction terms (such as nonlinearity correction terms) are values determined (such as by estimating) by the nonlinearity curve generation circuitry 140 to correct the digital data signal 130 and, thereby, generate the corrected digital data signal 134. For example, the adder circuitry 122 can apply the correction terms to the digital data signal 130 to generate the corrected digital data signal 134. The nonlinearity curve generation circuitry 140 can generate the correction terms based on the nonlinearity function terms of the nonlinearity function.

Also, nonlinearity components are the spurious components (such as spurious signal components) within a signal at frequencies other than the fundamental frequencies. For example, the spurious components of the digital data signal 130 are depicted in the second spectral plot 132 as the components at frequencies $f_2-f_1$, $2f_1-f_2$, $2f_2-f_1$, and $f_2+f_1$. These spurious components are example nonlinearity components of the digital data signal 130.

The nonlinearity curve generation circuitry 140 can refine its estimate of the correction terms based on outputs from the blind nonlinearity estimation circuitry 138. For example, the nonlinearity curve generation circuitry 140 can model the nonlinearity of the ADC 120 and generate the corrected digital data signal 134 based on the modeling. The blind nonlinearity estimation circuitry 138 can receive the corrected digital data signal 134 and model residual nonlinearity of the ADC 120 based on the corrected digital data signal 134. In some examples, the blind nonlinearity estimation circuitry 138 can model the residual nonlinearity of the ADC 120 by estimating residual coefficients of selected nonlinearity functions and/or an estimated input range of a signal that corresponds to the corrected digital data signal 134. For example, the blind nonlinearity estimation circuitry 138 can blindly estimate the residual coefficients of the nonlinearity functions of an ADC nonlinearity model without knowledge of the quality of the analog data signal 126.

In some examples, the blind nonlinearity estimation circuitry 138 can model the residual nonlinearity of the corrected digital data signal 134 with a linear combination of multiple nonlinear functions. For example, the blind nonlinearity estimation circuitry 138 can model the residual nonlinearity by using a sinusoid function (such as a sine function), a cosinusoid function (such as a cosine function), a periodic rectangular pulse function, or a periodic triangular pulse function with different periodicities and/or symmetry (such as odd or even symmetry). In some examples, the blind nonlinearity estimation circuitry 138 can alternately model the residual nonlinearity by using a function that has odd symmetry or a function that has even symmetry. Advantageously, these functions do not scale down with input signal power. Advantageously, such these functions are suitable for INL modeling across varying input signal levels when compared to conventional polynomial based function such as $x^k$.

In some examples, the blind nonlinearity estimation circuitry 138 can model the residual nonlinearity of the ADC 120 using the functions described below in Equation (1) and Equation (2):

$$x[n]=x_{ideal}[n]+f_{NL}(x_{ideal}[n]), \quad \text{Equation (1)}$$

$$y[n]=x[n]+\text{correction\_term}(x[n]), \quad \text{Equation (2)}$$

In the example of Equation (1) above, $x_{ideal}[n]$ is the desired output of the ADC 120 and $x[n]$ is the output of the ADC 120. In the example of Equation (2) above, correction_term($x[n]$) is the correction term to be applied by the correction look-up table 142 to output the corrected digital data signal 134. $x[n]$ has nonlinearity, which in the example of Equation (1) above, is represented by $f_{NL}(x_{ideal}[n])$. The nonlinear function $f_{NL}(x_{ideal}[n])$ models the nonlinearity to be estimated and corrected. The blind nonlinearity estimation circuitry 138 can split, divide, partition, etc., the nonlinear function $f_{NL}(x_{ideal}[n])$ as linear combinations of multiple nonlinear functions as described below in Equation (3):

$$f_{NL}(x)=\Sigma_{k=1}^{T} c_k f_k(x), \quad \text{Equation (3)}$$

In the example of Equation (3) above, k is an index, T is the total number of nonlinear functions used for splitting, $f_k$(x) is a nonlinear function, and $c_k$ is the coefficient/weight of the nonlinear function. The blind nonlinearity estimation circuitry 138 can determine/estimate $c_k$ for all of selected nonlinear functions for ADC nonlinearity estimation. Examples of nonlinear functions include polynomial functions (such as $x^k$), sinusoid or cosinusoid functions (such as sin(aπkx), cos(aπkx), etc.), periodic rectangular pulse functions, and periodic triangular pulse functions. Additionally and/or alternatively, $f_k$ (x) may be any other type of nonlinear function. In some examples, a periodic rectangular pulse function may be a function such as sign(x) (such as sign(sin(aπkx)), sign(cos(aπkx)), etc.). For example, sign(x) can be a function with an output of 1 if x>0, −1 if x<0, and 0 if x is 0.

In some examples, a periodic triangular pulse function may be implemented by the examples of Equation (4) and/or Equation (5) below:

$$f_{triag1}(x) = \begin{cases} 1+2kx & -\frac{1}{k} \leq x \leq 0 \\ 1-2kx & 0 < x \leq \frac{1}{k} \end{cases}, \quad \text{Equation (4)}$$

$$f_{triag2}(x) = \begin{cases} 2kx & -\frac{1}{2k} \leq x \leq \frac{1}{k} \\ 2-2kx & \frac{1}{2k} \leq x \leq \frac{1}{k} \\ -2-2kx & -\frac{1}{k} \leq x \leq -\frac{1}{2k} \end{cases}, \quad \text{Equation (5)}$$

The blind nonlinearity estimation circuitry 138 can determine the residual nonlinearity components of y[n] using nonlinearity functions/terms, such as sin(aπkx), cos (aπkx), etc. In some examples, the term alpha (a) is representative of the receiver (RX) input signal level, or input range, of the ADC 120. For example, the RX input signal level can be a range of values of the corrected digital data signal 134. For example, a for a sinusoid function can be represented by the example of Equation (6) below. Additionally and/or alternatively, a can be represented by any another function.

$$\alpha = \left(\frac{\text{amplitude}_{maximum} - \text{amplitude}_{minimum}}{2}\right), \quad \text{Equation (6)}$$

In some examples, the blind nonlinearity estimation circuitry 138 can generate a histogram of input samples of blind ADC NL estimation. The blind nonlinearity estimation circuitry 138 can determine an estimate of an input range of a based on determining a maximum and minimum amplitude from the histogram and calculating a as described above in the example of Equation (6).

In response to estimating the residual nonlinearity of the corrected digital data signal 134, the blind nonlinearity estimation circuitry 138 can output the coefficients of non-linear functions selected for ADC nonlinearity modeling and the estimated input range to the nonlinearity curve generation circuitry 140. The nonlinearity curve generation circuitry 140 can regenerate the curve, which models the digital data signal 130, based on the residual nonlinearity coefficients and the estimated input range. The nonlinearity curve generation circuitry 140 can update or refine correction terms stored in the correction look-up table 142 based on the regenerated curve. The nonlinearity curve generation circuitry 140 can write the new correction terms in the correction look-up table 142. The correction look-up table 142 can identify new one(s) of the correction terms based on the digital data signal 130 and output the new one(s) of the correction terms to the adder circuitry 122. The adder circuitry 122 can generate the corrected digital data signal 134 based on the new one(s) of the correction terms.

In example operation, the adder circuitry 122 can provide, deliver, and/or otherwise output the corrected digital data signal 134 to the DSP 114, which includes an example digital down-converter (DDC) 144. In the DSP 114, the DDC 144 down-converts the corrected digital data signal 134 to provide and/or otherwise generate down-converted in-phase and quadrature-phase data to downstream circuitry (not shown) for further processing, for instance for audio and/or video output. For example, the DDC 144 can multiply the corrected digital data signal 134 by sine and cosine signals of a local oscillator to generate the down-converted data. Advantageously, the blind nonlinearity estimation circuitry 138, and/or, more generally, the nonlinearity correction circuitry 104, can compensate for nonlinearity of the ADC 120 by estimating the residual nonlinearity of the corrected digital data signal 134.

Figure 2:
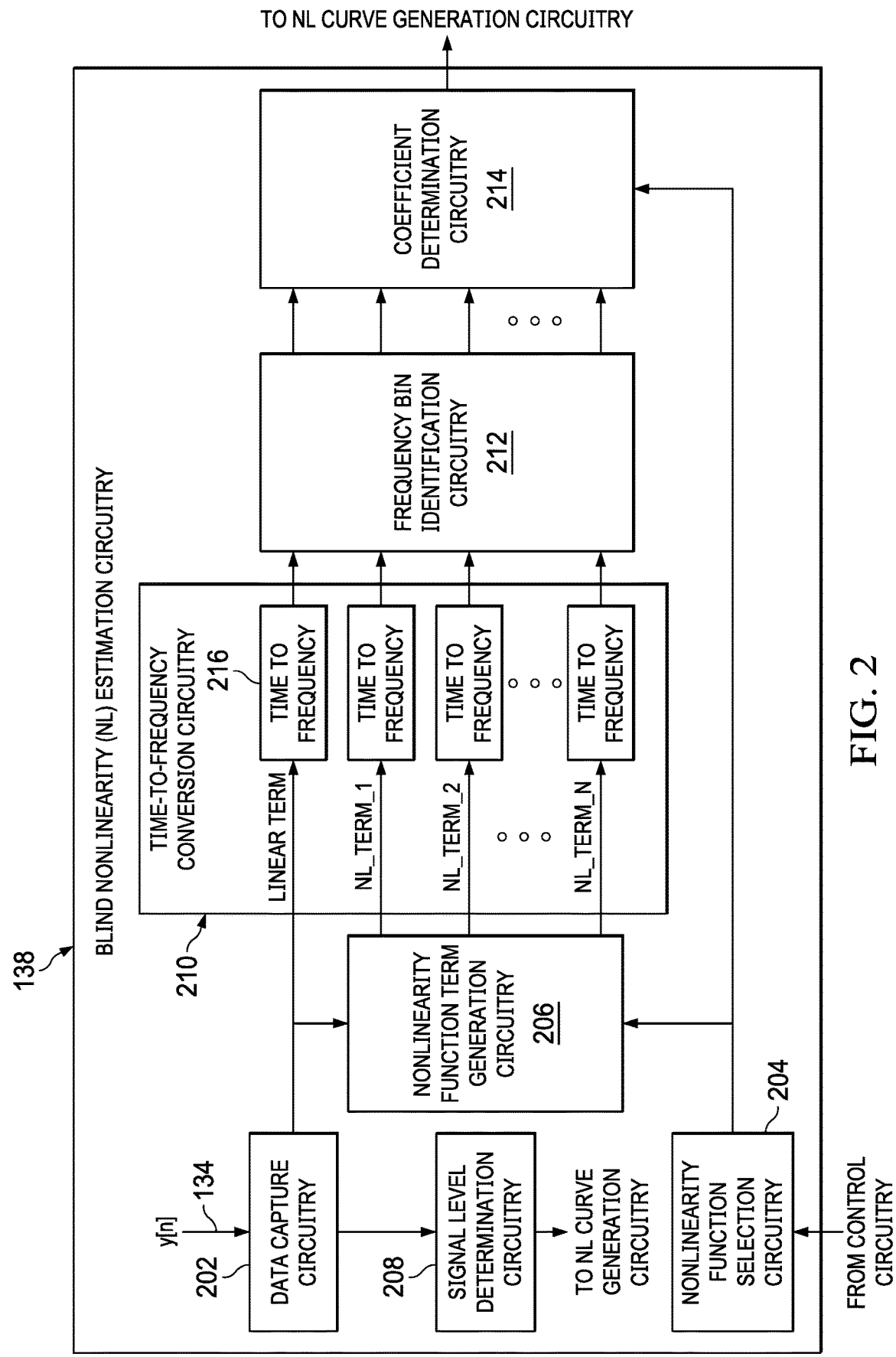
FIG. 2 is a schematic diagram of an example implementation of the blind nonlinearity estimation circuitry of FIG. 1, which includes example frequency bin identification circuitry and example coefficient determination circuitry.

FIG. 2 is a schematic diagram of an example implementation of the blind nonlinearity estimation circuitry 138 of FIG. 1. The blind nonlinearity estimation circuitry 138 can process a digital output signal, such as the corrected digital data signal 134, to achieve nonlinearity correction of an electronic system, such as the system 100 of FIG. 1.

The blind nonlinearity estimation circuitry 138 of the illustrated example includes example data capture circuitry 202, example nonlinearity function selection circuitry 204, example nonlinearity function term generation circuitry 206, example signal level determination circuitry 208, example time-to-frequency conversion circuitry 210, example frequency bin identification circuitry 212, and example coefficient determination circuitry 214. In some examples, the data capture circuitry 202, the nonlinearity function selection circuitry 204, the nonlinearity function term generation circuitry 206, the signal level determination circuitry 208, the time-to-frequency conversion circuitry 210, the frequency bin identification circuitry 212, and/or the coefficient determination circuitry 214 is/are implemented as circuitry in hardware (such as one or more logic circuits, a hardware-implemented state machine, etc.) or firmware, or implemented by processor circuitry executing instructions stored in memory.

Output(s) of the adder circuitry 122 of FIG. 1 can be coupled to input(s) of the data capture circuitry 202. Output(s) of the data capture circuitry 202 is/are coupled to input(s) of the nonlinearity function term generation circuitry 206, the signal level determination circuitry 208, and the time-to-frequency conversion circuitry 210. Input(s) of the nonlinearity function selection circuitry 204 can be coupled to output(s) of the control circuitry 124 of FIG. 1. Output(s) of the nonlinearity function selection circuitry 204 is/are coupled to input(s) of the nonlinearity function term generation circuitry 206 and the coefficient determination circuitry 214. Output(s) of the signal level determination circuitry 208 is/are coupled to input(s) of the nonlinearity curve generation circuitry 140 of FIG. 1. Output(s) of the time-to-frequency conversion circuitry 210 is/are coupled to input(s) of the frequency bin identification circuitry 212. Output(s) of the frequency bin identification circuitry 212 is/are coupled to input(s) of the coefficient determination circuitry 214. Output(s) of the coefficient determination circuitry 214 can be coupled to the nonlinearity curve generation circuitry 140 of FIG. 1.

In example operation, the control circuitry 124 can instruct the nonlinearity function selection circuitry 204 to select a nonlinearity function to employ and/or characteristic(s) or configuration(s) thereof. For example, the control circuitry 124 can output first data, a first control signal, a first flag (such as a control flag), a first command, etc., to the nonlinearity function selection circuitry 204. The control circuitry 124 can generate the first command to instruct the nonlinearity function selection circuitry 204 to select a type of nonlinearity function to employ, which can include a sinusoid function, a cosinusoid function, a periodic triangular pulse function, a periodic rectangular pulse function, or any other function. For example, the first command can be representative of a type of nonlinearity function, characteristic(s) thereof, etc. The control circuitry 124 can generate the command data to instruct the nonlinearity function selection circuitry 204 to select a characteristic of the nonlinearity function, such as the nonlinearity function having even or odd symmetry (such as even or odd mathematical symmetry).

In some examples, the control circuitry 124 can generate the first command to instruct the nonlinearity function selection circuitry 204 to select a first type of function (and/or characteristic(s) thereof) for a first computational cycle (such as one or more first clock cycles). In some examples, the control circuitry 124 can generate a second command to instruct the nonlinearity function selection circuitry 204 to select a second type of function $f$ or a second computational cycle (such as one or more second clock cycles), which can be after the first computational cycle of the blind nonlinearity estimation circuitry 138, and/or, more generally, the system 100 of FIG. 1. For example, the first type of function can be a sinusoid function with odd symmetry and the second type of function can be a sinusoid function with even symmetry. In some examples, the first type of function can be a sinusoid function with odd symmetry and the second type of function can be a periodic triangular pulse function with odd or even symmetry. Advantageously, the blind nonlinearity estimation circuitry 138 may not need to estimate the first and second types of function substantially simultaneously or in parallel as the first and second types of function can be orthogonal to each other.

In example operation, the nonlinearity function selection circuitry 204 can instruct the nonlinearity function term generation circuitry 206 and the coefficient determination circuitry 214 on which nonlinearity function and/or characteristic(s) thereof to utilize. For example, the nonlinearity function selection circuitry 204 can instruct the nonlinearity function term generation circuitry 206 to generate one or more nonlinearity function terms for a sinusoid function having odd symmetry. In some examples, the nonlinearity function selection circuitry 204 can instruct the coefficient determination circuitry 214 to generate one or more coefficients for a nonlinearity curve based on the one or more nonlinearity function terms corresponding to the sinusoid function having odd symmetry.

In example operation, the data capture circuitry 202 captures (such as selectably captures) raw data samples of the corrected digital data signal 134. In some examples, the data capture circuitry 202 receives the raw data samples. The data capture circuitry 202 outputs the captured data samples to at least one of the nonlinearity function term generation circuitry 206, the signal level determination circuitry 208, or the time-to-frequency conversion circuitry 210. The signal level determination circuitry 208 can determine a signal level of the corrected digital data signal 134 based on the captured data samples. For example, the signal level determination circuitry 208 can determine an amplitude for one(s) of the respective raw data samples and determine an envelope of the amplitude(s). In some examples, the signal level determination circuitry 208 can determine the signal level based on the amplitude(s) (e.g., a range of the amplitude(s), a histogram of the amplitude(s), etc.), the envelope, etc. In some examples, the signal level determination circuitry 208 can determine statistics (such as a maximum amplitude, a maximum signal level statistic, a minimum amplitude, a minimum signal level statistic, etc.) to calculate an estimate of the signal level. In some examples, the signal level determination circuitry 208 can compute a histogram or any other type of data structure based on the amplitude(s), the envelope, etc., of the captured data samples to calculate the estimate of the signal level of the corrected digital data signal 134. The signal level determination circuitry 208 can output data representative of the signal level to the nonlinearity curve generation circuitry 140 of FIG. 1.

The nonlinearity function term generation circuitry 206 receives captured data from the data capture circuitry 202 and processes the data to output nonlinearity function terms (identified by NL_TERM_1, NL_TERM_2, NL_TERM_N). For example, the nonlinearity function term generation circuitry 206 can generate the nonlinearity function terms for a type of function indicated by the nonlinearity function selection circuitry 204. In some examples, the data capture circuitry 202 can capture a set of 256+Δ samples from the corrected digital data signal 134. For example, the ADC 120 of FIG. 1 can have a sampling rate of 256 and the data capture circuitry 202 can capture a set of 256+Δ samples based on the sampling rate of 256 of the ADC 120. The additional samples (4) may be captured to mitigate memory effects of the blind nonlinearity estimation circuitry 138. The nonlinearity function term generation circuitry 206 can generate different nonlinearity function terms, such as sin(aπkx) (or cos(aπkx)). For example, the nonlinearity function term generation circuitry 206 can generate nonlinearity function terms of the function sin(aπkx) based on each of the 256 samples.

In example operation, the data capture circuitry 202 outputs captured data samples (identified as LINEAR TERM in FIG. 2) of the corrected digital data signal 134 to the time-to-frequency conversion circuitry 210. The nonlinearity function term generation circuitry 206 outputs the nonlinearity function terms (e.g., NL_TERM_1, NL_TERM_2, . . . NL_TERM_N) to the time-to-frequency conversion circuitry 210. The time-to-frequency conversion circuitry 210 converts the linear term and the nonlinearity function terms from a time-domain representation to a frequency-domain representation. For example, time-to-frequency conversion circuitry blocks 216 (only one of four labeled) of the time-to-frequency conversion circuitry 210 apply a fast Fourier transform (FFT) to the linear term and the nonlinearity function terms. In some examples, the time-to-frequency conversion circuitry 210 can apply an FFT after multiplying input data (such as the linear term, the nonlinearity function terms, etc.) by another function such as a window function. Alternatively, the time-to-frequency conversion circuitry blocks 216 may convert the linear term and/or the nonlinearity function terms from the time domain to the frequency domain using any other technique.

In example operation, the time-to-frequency conversion circuitry 210 outputs the frequency domain data to the frequency bin identification circuitry 212. The frequency bin identification circuitry 212 can process the frequency domain data to identify frequency bins to be used for generating nonlinearity function coefficients (such as the residual nonlinearity coefficients of FIG. 1) by the coefficient determination circuitry 214. Frequency bins are intervals between samples in the frequency domain. By way of example, if the sample rate of the data capture circuitry 202 is 100 Hz and the FFT size of the time-to-frequency conversion circuitry blocks 216 is 100, then there are 100 points between (0-100 Hz). The entire 100 Hz range can be divided into 100 intervals (such as 0-1 Hz, 1-2 Hz, etc.). Each such small interval, such as 0-1 Hz, can be a frequency bin.

In some examples, the frequency bin identification circuitry 212 can identify frequency bins that have a high level of created nonlinearity function terms (such as the nonlinearity function terms determined by the nonlinearity function term generation circuitry 206) and a low level of input signal as compared to respective thresholds. The frequency bin identification circuitry 212 can output indications of the identified frequency bins to the coefficient determination circuitry 214. For example, the coefficient determination circuitry 214 can process the identified one(s) of the frequency bins to estimate and track nonlinearity function coefficients for each DSA range. In some examples, the coefficient determination circuitry 214 performs, executes, and/or otherwise implements a multi-state Kalman filter to generate the nonlinearity function coefficients. For example, the nonlinearity function terms can serve as weights to the coefficients to be estimated by the multi-state Kalman filter at the frequency bins selected by the frequency bin identification circuitry 212.

With further regards to the estimation performed by the coefficient determination circuitry 214, assume by way of example that the digital nonlinearity correction applied to the corrected digital data signal 134 from the adder circuitry 122 is modeled as:

$$y[n] = x_{ideal}[n] + f_{NL}(x_{ideal}[n]) + \text{noise}, \quad \text{Equation (7)}$$

$$f_{NL}(x) = \Sigma_{k=1}^{T} c_k f_k(x), \quad \text{Equation (8)}$$

$$y[n] = x_{ideal}[n] + \Sigma_{k=1}^{T} c_k f_k(x_{ideal}[n]) + \text{noise}, \quad \text{Equation (9)}$$

Equation (10) below is yielded after a rearrangement of the terms above.

$$\Sigma_{k=1}^{T} c_k f_k(x_{ideal}[n]) = y[n] - x_{ideal}[n] - \text{noise}, \quad \text{Equation (10)}$$

Since we do not have $x_{ideal}[n]$ signal, a first order of approximation is made to simplify, which is, $f_k(x_{ideal}[n]) \approx f_k(x[n])$. This approximation works for a non-linear function because ADC nonlinearity level is −55 dBFS or below at a maximum input level. Hence, Equation (11) below may be realized:

$$\Sigma_{k=1}^{T} c_k f_k(x[n]) = y[n] - x_{ideal}[n] - \text{noise}, \quad \text{Equation (11)}$$

The example of Equation (11) above can be represented in the frequency domain as the example of Equation (12) below:

$$\Sigma_{k=1}^{T} c_k F(f_k(x[n])) = F(y[n]) - F(x_{ideal}[n]) - F(\text{noise}), \quad \text{Equation (12)}$$

In the example of Equation (12) above, F(.) carries out an FFT operation to convert a time domain signal to its frequency domain representation, and Equation (12) is valid for each frequency bin. F(.) is an FFT function applied to the contents of the parentheses (e.g., $x_{ideal}[n]$, noise, etc.). The left side of Equation (12) represents the nonlinearity introduced by the ADC 120. At frequency bins where there is no ADC input signal ($F(x_{ideal}[n]) = 0$), the above Equation (12) can be represented as:

$$\Sigma_{k=1}^{T} c_k F(f_k(x[n])) = F(y[n]) - F(\text{noise}), \quad \text{Equation (13)}$$

The example of Equation (13) above is a linear equation that can be used for estimating the nonlinearity function coefficients $c_k$. Also, the raw nonlinearity levels are below about −55 dBFS. In some examples, all frequency bins whose signal level is lower than a threshold, such as −55 dBFS, can be used for estimating the coefficients.

The coefficient determination circuitry 214 identifies multiple such linear equations and solves the equations to estimate all nonlinearity function term coefficients. Namely, for each selected bin, there is one linear equation. For example, for $x^3[n]$ nonlinearity function (or any other third order nonlinearity function or a combination of third order nonlinearity function terms), each data block provides six equations for a two tone input. If there are 100 data capture blocks in one nonlinearity estimation window, then 600 equations would be stored as described below in the example of Equation (14).

$$\begin{matrix} eq_1 \to \\ eq_2 \to \\ \vdots \\ eq_N \to \end{matrix} \begin{bmatrix} h_{1,1} & h_{1,2} & \cdots & h_{1,T} \\ h_{2,1} & h_{2,2} & \cdots & h_{2,T} \\ \vdots & \vdots & \ddots & \vdots \\ h_{N,1} & h_{N,2} & \cdots & h_{N,T} \end{bmatrix} c = \begin{bmatrix} m_1 \\ m_2 \\ \vdots \\ m_N \end{bmatrix} \to Hc = m, \quad \text{Equation (14)}$$

where: N is the number of equations, such as in Equation (14); T is the number of nonlinearity function terms; $h_{i,j}$ is the Fourier transform of the jth nonlinearity function term from the ith equation at the selected frequency bins from the selected capture set; c is a Tx1 vector of nonlinear function coefficients to be estimated; and $m_i$ is the measurement of the ith equation that is the Fourier transform of the corrected digital data signal 134 at the selected frequency bins from the selected capture set. Such a system of linear equations (such as Hc=m) is solved (such as by using a least squares or Kalman filter based technique) to estimate and track the nonlinearity function coefficients. Advantageously, the coefficient determination circuitry 214 can output the nonlinearity function coefficients to the nonlinearity curve generation circuitry 140. The nonlinearity curve generation circuitry 140 can regenerate a nonlinearity curve (such as an ADC INL curve) based on the nonlinearity function coefficients and selected nonlinear function f or improved performance of the nonlinearity correction circuitry 104.

Figure 3:
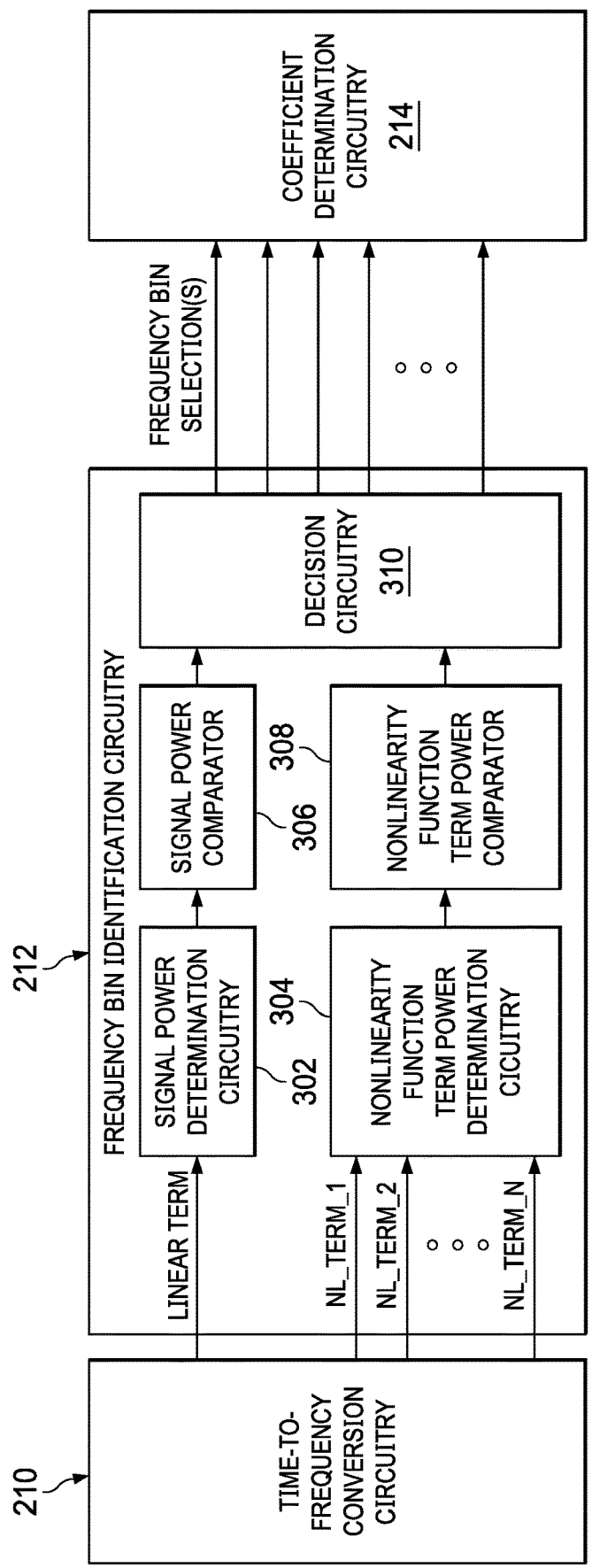
FIG. 3 is a schematic diagram of an example implementation of the frequency bin identification circuitry of FIG. 2.

FIG. 3 is a schematic diagram of an example implementation of the frequency bin identification circuitry 212 of FIG. 2. The frequency bin identification circuitry 212 includes example signal power determination circuitry 302, example nonlinearity function term power determination circuitry 304, an example signal power comparator 306, an example nonlinearity function term power comparator 308, and example decision circuitry 310. In some examples, the signal power determination circuitry 302, the nonlinearity function term power determination circuitry 304, the signal power comparator 306, the nonlinearity function term power comparator 308, and/or the decision circuitry 310 is/are implemented as circuitry in hardware (such as one or more logic circuits, a hardware-implemented state machine, etc.) or firmware, or implemented by processor circuitry executing instructions stored in memory.

Input(s) of the signal power determination circuitry 302 is/are coupled to output(s) of the time-to-frequency conversion circuitry 210 of FIG. 2. For example, the signal power determination circuitry 302 can receive the linear term of FIG. 2 in frequency-domain representation. The signal power determination circuitry 302 can compute and/or otherwise determine a value of signal power for each frequency bin of the linear term. In some examples, the signal power determination circuitry 302 can calculate and/or otherwise determine a signal power at each bin equal to a magnitude square of a signal response FFT output at that bin (such as $|Y(k)^2|$, where $Y(k)$ is the FFT of $y[n]$ at bin k).

Input(s) of the nonlinearity function term power determination circuitry 304 is/are coupled to output(s) of the time-to-frequency conversion circuitry 210 of FIG. 2. For example, the nonlinearity function term power determination circuitry 304 can receive the nonlinearity function terms (identified by NL_TERM_1, NL_TERM_2, NL_TERM_N) of FIG. 2 in frequency-domain representation. The nonlinearity function term power determination circuitry 304 can calculate and/or otherwise determine a value of nonlinearity function term power for each frequency bin of the nonlinearity function terms. For example, the nonlinearity function term power determination circuitry 304 can calculate a value of nonlinearity function term power for a given frequency bin as the sum of the squared magnitude, such as the sum of the magnitudes of all nonlinearity function terms at the given frequency bin. In some examples, the nonlinearity function term power determination circuitry 304 can determine a value of nonlinearity function term power for a given frequency bin by identifying nonlinearity function term(s) whose magnitude exceeds a threshold (such as a nonlinearity power threshold); and computing a sum of the magnitude(s) of the identified nonlinearity function term(s) as the nonlinearity function term power. In some examples, the nonlinearity function term power determination circuitry 304 can determine the magnitude of each nonlinearity function term's frequency response at a given frequency bin and compare the magnitudes with a threshold (such as a nonlinearity power threshold). In some examples, even if one of the nonlinearity function term's frequency responses at the given frequency bin crosses the threshold it is considered as passing the threshold.

By way of example, assume the nonlinearity function terms to be NL_TERM_1, NL_TERM_2, NL_TERM_3, etc., then one metric for determining whether there is a high level of created nonlinearity function terms at a frequency bin is:

$$|F(NL\_TERM\_1)|^2 + |F(NL\_TERM\_2)|^2 + \ldots > NLThresh, \quad \text{Equation (15)}$$

and a metric for determining a low level of signal level at a frequency bin is:

$$|F(Y(n))|^2 < SigThresh, \quad \text{Equation (16)}$$

In some examples, both of the conditions as set forth in Equation (15) and Equation (16) above are met when determining to select a frequency bin for estimation.

In the illustrated example, output(s) of the signal power determination circuitry 302 is/are coupled to input(s) of the signal power comparator 306. In example operation, the signal power comparator 306 can compare the frequency bin signal power values generated by the signal power determination circuitry 302 to a signal power threshold (such as SigThresh as identified above in Equation (16)).

In the illustrated example, output(s) of the nonlinearity function term power determination circuitry 304 is/are coupled to input(s) of the nonlinearity function term power comparator 308. In example operation, the nonlinearity function term power comparator 308 can compare the frequency bin nonlinearity function term power values generated by the nonlinearity function term power determination circuitry 304 to a nonlinearity function term power threshold (such as NLThresh as identified above in Equation (15)).

In the illustrated example, output(s) of the signal power comparator 306 and the nonlinearity function term power comparator 308 is/are coupled to input(s) of the decision circuitry 310. Output(s) of the decision circuitry 310 is/are coupled to input(s) of the coefficient determination circuitry 214 of FIG. 2. In example operation, the decision circuitry 310 can identify the frequency bins (identified as FREQUENCY BIN SELECTION(S)) to be applied in nonlinearity function coefficient estimation based on the results of the comparisons executed by the signal power comparator 306 and the nonlinearity function term power comparator 308. In some examples, the decision circuitry 310 can select frequency bins for use in nonlinearity function coefficient estimation responsive to determinations that the frequency bins have a high nonlinearity function term power (such as a power above the nonlinearity function term power threshold, NLThresh) and a low signal power (such as a power below the signal power threshold, SigThresh). For example, the decision circuitry 310 can identify frequency bins, for which (i) the signal power is less than the signal power threshold and (ii) the nonlinearity function term power is greater than the nonlinearity function term power threshold, as suitable for use in nonlinearity function coefficient estimation (such as nonlinearity function coefficient estimation executed by the coefficient determination circuitry 214 of FIG. 2).

By way of an example for a combination of second and third order nonlinearity function terms, with a single tone input at f, the decision circuitry 310, and/or, more generally, the frequency bin identification circuitry 212, selects only the bins corresponding to 0, 2f, and 3f for use in nonlinearity function coefficient estimation.

By way of an example for a combination of second and third order nonlinearity function terms, with two tone inputs f1 and f2, the decision circuitry 310, and/or, more generally, the frequency bin identification circuitry 212, selects both the second order bins (0, f2−f1, 2f1, f1+f2, and 2f2) and the third order bins (2f1−f2, 2f2−f1, 2f1+f2, 3f1, 3 f2, 2f2+f1) excluding the fundamental bins f1 and f2.

Figure 4:
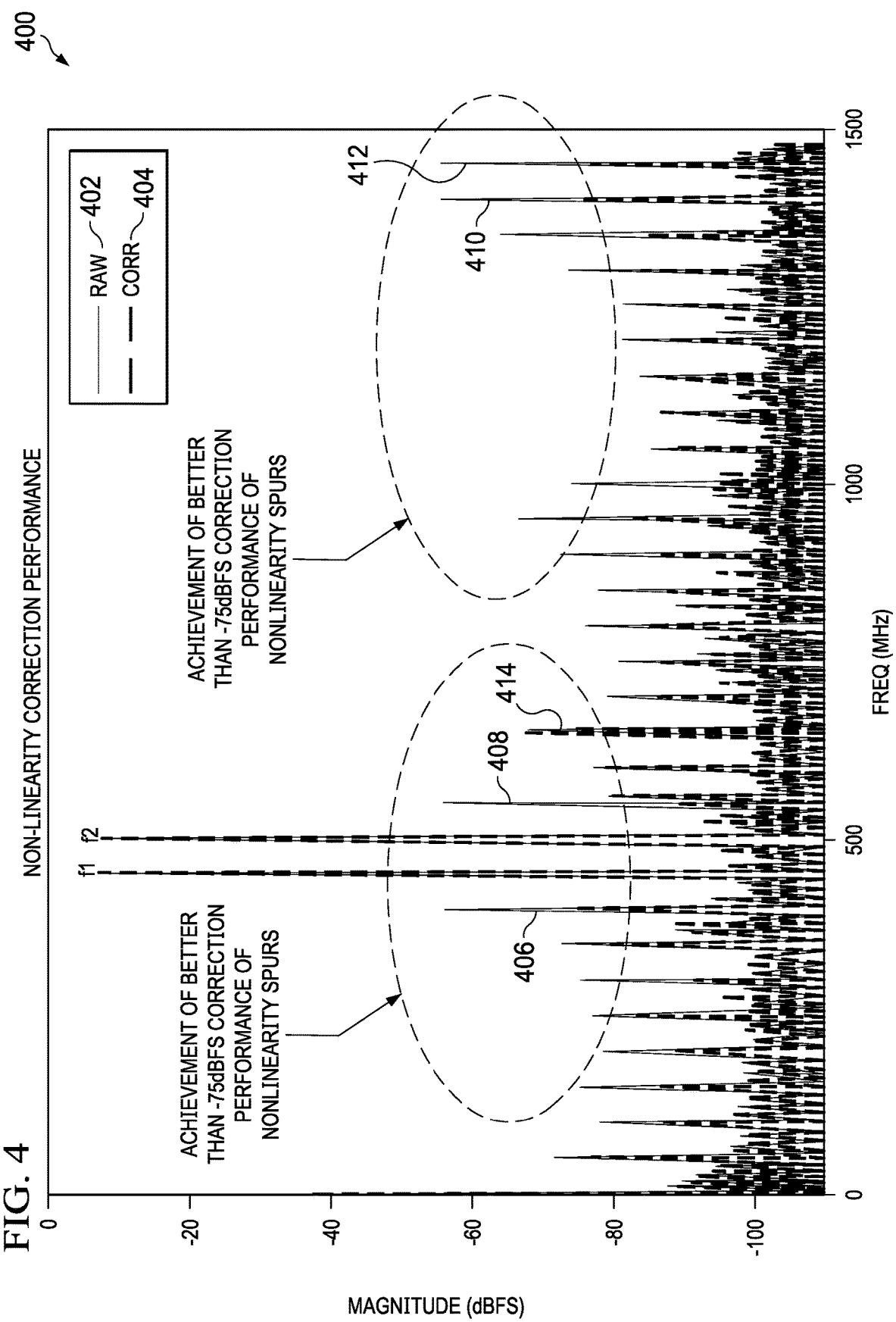
FIG. 4 is a graph of example nonlinearity correction performance associated with the blind nonlinearity estimation circuitry of FIGS. 1 and/or 2.

FIG. 4 is a graph 400 of example nonlinearity correction performance associated with the blind nonlinearity estimation circuitry 138, and/or, more generally, the nonlinearity correction circuitry 104 of FIGS. 1 and/or 2. The graph 400 includes an x-axis that represents frequency in megahertz (MHz) and a y-axis that represents magnitude in dBFS. The graph 400 can be representative of the antenna 106 receiving the RF signal 116 where the RF signal 116 has two −7 dBFS amplitude tones at 3.4 gigahertz (GHz) and 3.45 GHz. The graph 400 can be representative of the ADC 120 of FIG. 1 that is configured to have an ADC sampling rate of 2949.12 mega-samples per second (Msps). The graph 400 can be representative of the nonlinearity function selection circuitry 204 of FIG. 2 selecting a sinusoid function to model the ADC residual nonlinearity. For example, the nonlinearity function selection circuitry 204 can instruct the nonlinearity function term generation circuitry 206 to generate one or more nonlinearity function terms for a sin(αxkx) or cos (αxkx) INL function. In some examples, k can be a value in a set of [1,8] (such as k∈[1,8]) and/or a can have a value of 1.0.

The graph 400 depicts first example amplitudes 402 representative of raw or uncorrected digital data. For example, the first amplitudes 402 can correspond to amplitudes of the digital data signal 130 of FIG. 1. The graph 400 depicts second example amplitudes 404 representative of corrected digital data signal. For example, the second amplitudes 404 can correspond to amplitudes of the corrected digital data signal 134 of FIG. 1.

The graph 400 includes amplitudes at fundamental frequencies f1 and f2 and multiple spurious components (also referred to as spurs or nonlinearity spurs). In the illustrated example, f1 is 480 MHz and f2 is 500 MHz with magnitudes of approximately −7 dbFS. In the illustrated example, the first amplitudes 402 include first example spurs 406, 408 410, 412 with magnitudes of approximately −58 dbFS. In the illustrated example, the second amplitudes 404 include a second example spur 414 with a magnitude of approximately −75 dbFS, which is representative of approximately a −17 dbFS improvement. Advantageously, the blind nonlinearity estimation circuitry 138, and/or, more generally, the nonlinearity correction circuitry 104 of FIGS. 1 and/or 2, can achieve better than −75 dBFS correction performance of nonlinearity spurs. For example, the blind nonlinearity estimation circuitry 138 can estimate nonlinearity function coefficients for determination of correction terms that, when applied to the digital data signal 130, can reduce magnitude(s) of nonlinearity spurs thereof to meet target SFDR specifications (such as a target SFDR specification of −75 dBFS).

Figure 5:
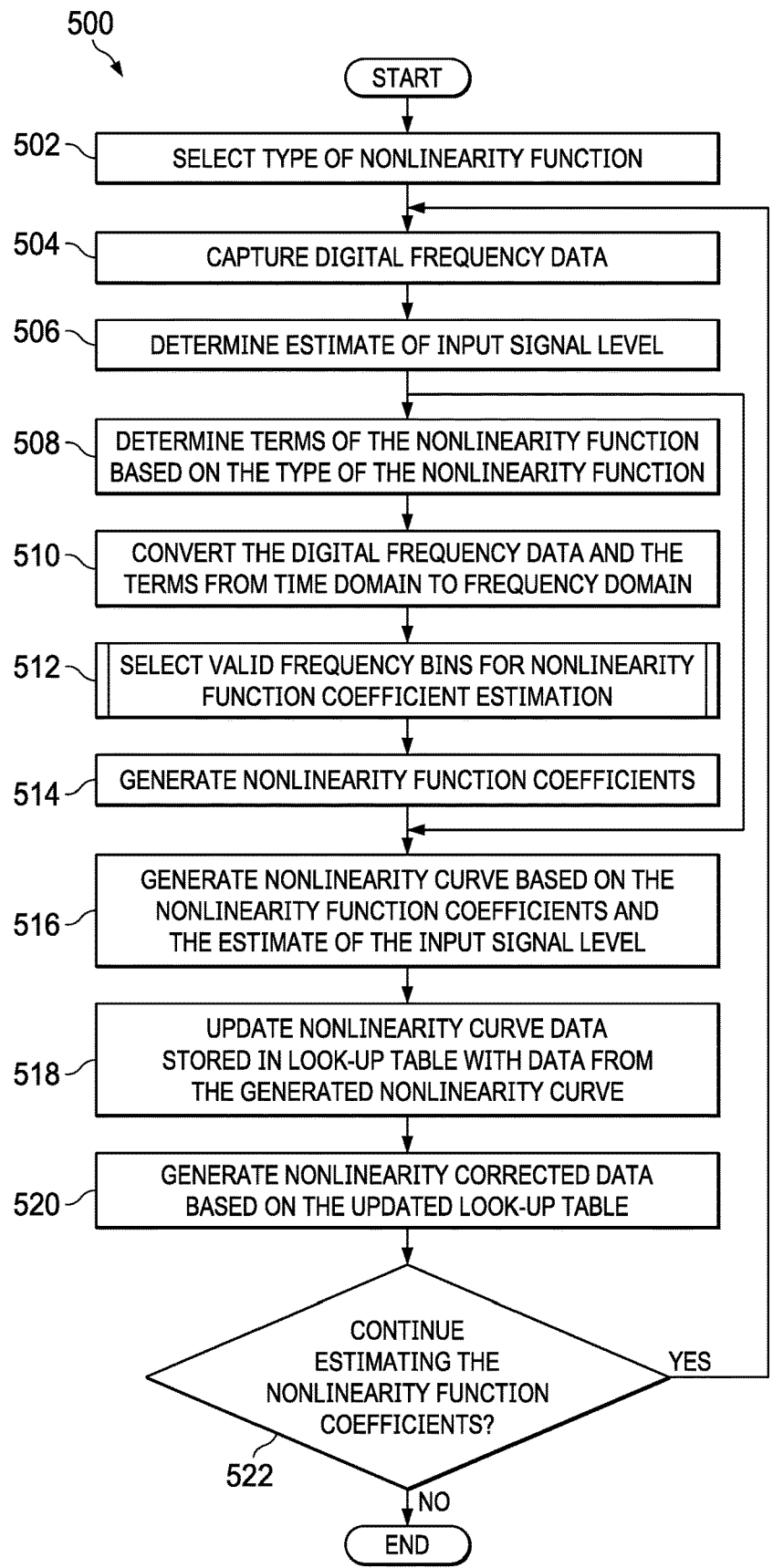
FIG. 5 is a flowchart representative of an example process that may be performed using machine readable instructions that can be executed and/or hardware configured to implement the blind nonlinearity estimation circuitry of FIGS. 1 and/or 2, and/or, more generally, the system of FIG. 1, to generate nonlinearity corrected data based on nonlinearity correction terms.
Figure 6:
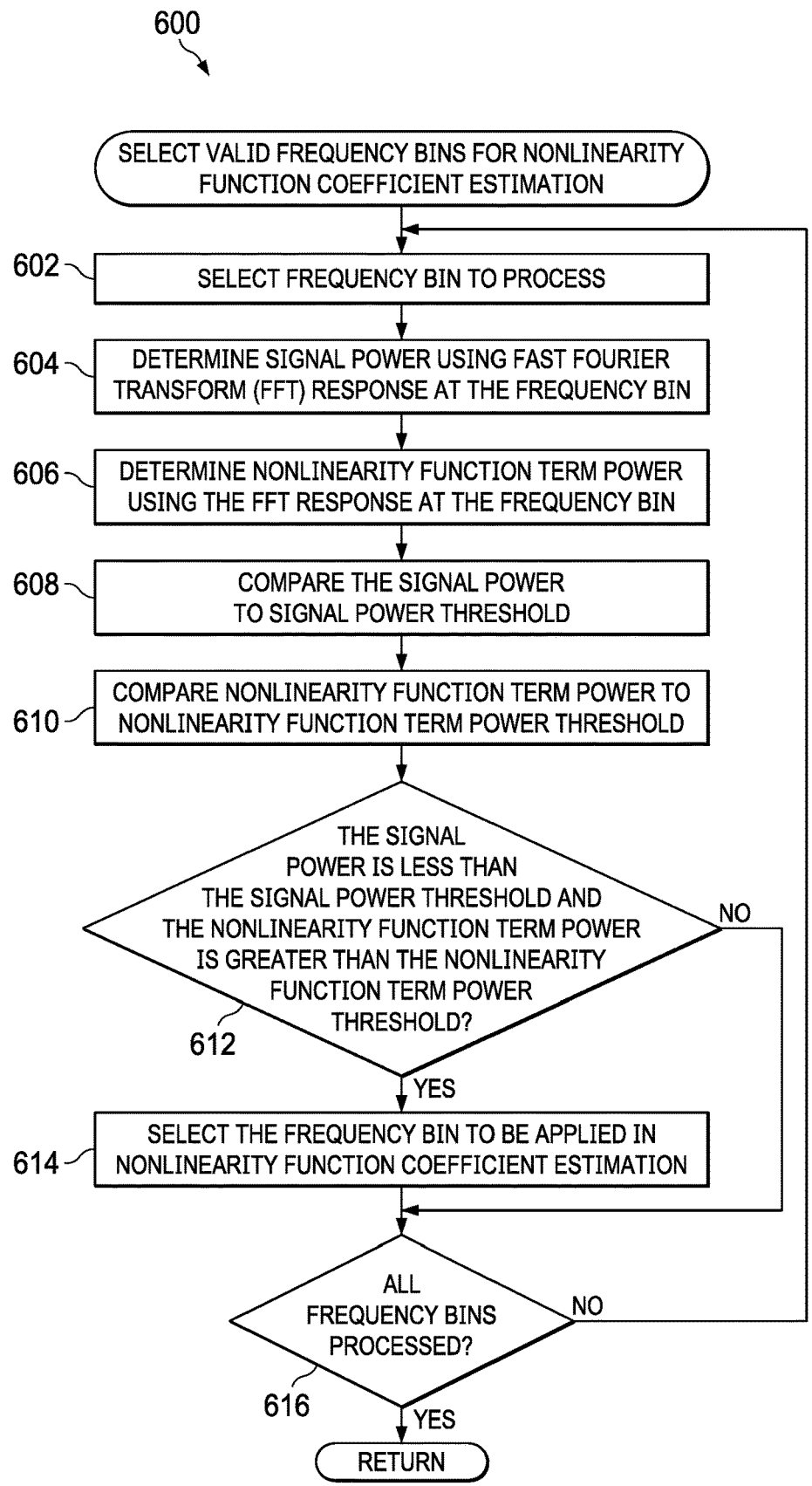
FIG. 6 is a flowchart representative of an example process that may be performed using machine readable instructions that can be executed and/or hardware configured to implement the blind nonlinearity estimation circuitry of FIGS. 1 and/or 2, and/or, more generally, the system of FIG. 1, to select frequency bins corresponding to one(s) of terms based on at least one of a signal power threshold or a nonlinearity power threshold.

Flowcharts representative of example hardware logic circuitry, machine readable instructions, hardware implemented state machines, and/or any combination thereof for implementing the blind nonlinearity estimation circuitry 138 of FIGS. 1 and/or 2, and/or, more generally, the nonlinearity correction circuitry 104 of FIG. 1, are shown in FIGS. 5-6. The machine readable instructions may be one or more executable programs or portion(s) of an executable program for execution by processor circuitry, such as the processor circuitry 712 shown in the system 100 discussed below in connection with FIG. 7. The program may be embodied in software stored on one or more non-transitory computer readable storage media such as a hard-disk drive (HDD), a solid-state disk (SSD), a volatile memory, or a non-volatile memory associated with processor circuitry located in one or more hardware devices, but the entire program and/or parts thereof could alternatively be executed by one or more hardware devices other than the processor circuitry and/or embodied in firmware or dedicated hardware. The non-transitory computer readable storage media may include one or more mediums located in one or more hardware devices. Further, although the example program(s) is/are described with reference to the flowcharts illustrated in FIGS. 5-6, many other methods of implementing the nonlinearity correction circuitry 104 may alternatively be used. For example, the order of execution of the blocks may be changed, and/or some of the blocks described may be changed, eliminated, or combined. Additionally or alternatively, any or all of the blocks may be implemented by one or more hardware circuits (such as processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be local to one or more hardware devices (such as a single-core processor (such as a single core central processor unit (CPU)), a multi-core processor (such as a multi-core CPU), etc.) in a single machine, multiple processors distributed across multiple servers of a server rack, multiple processors distributed across one or more server racks, a CPU and/or a FPGA located in the same package (such as the same IC package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (such as portions of instructions, code, representations of code, etc.) that may be utilized to create, manufacture, and/or produce machine executable instructions. The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry but require addition of a library (such as a dynamic link library (DLL)), a software development kit (SDK), an application programming interface (API), etc., in order to execute the machine readable instructions on a particular computing device or other device. In another example, the machine readable instructions may need to be configured (such as settings stored, data input, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: Assembly, C, C++, Java, C #, Perl, Python, JavaScript, HyperText Markup Language (HTML), Structured Query Language (SQL), Swift, etc.

As mentioned above, the example operations of FIGS. 5-6 may be implemented using executable instructions (such as computer and/or machine readable instructions) stored on one or more non-transitory computer and/or machine readable media such as optical storage devices, magnetic storage devices, an HDD, a flash memory, a read-only memory (ROM), a cache, a RAM of any type, a register, and/or any other storage device or storage disk in which information is stored for any duration (such as for extended time periods, permanently, for brief instances, for temporarily buffering, and/or for caching of the information). As used herein, the terms non-transitory computer readable medium and non-transitory computer readable storage medium are expressly defined to include any type of computer readable storage device and/or storage disk and to exclude propagating signals and to exclude transmission media.

FIG. 5 is a flowchart representative of an example process 500 that may be performed using machine readable instructions that can be executed and/or hardware configured to implement the blind nonlinearity estimation circuitry 138 of FIGS. 1 and/or 2, and/or, more generally, the nonlinearity correction circuitry 104 of FIG. 1, and/or, more generally, the system 100 of FIG. 1, to generate nonlinearity corrected data based on correction terms in the correction look-up table 142. The process 500 of FIG. 5 begins at block 502, at which the nonlinearity correction circuitry 104 selects a type of nonlinearity function. For example, the control circuitry 124 can instruct the nonlinearity function selection circuitry 204 to select a first type of function, such as a sinusoid function, and characteristic(s) thereof, such as the sinusoid having odd or even symmetry.

At block 504, the nonlinearity correction circuitry 104 captures digital frequency data. For example, the data capture circuitry 202 can capture digital frequency data, such as the corrected digital data signal 134. In some examples, the data capture circuitry 202 can inspect, analyze, and/or otherwise examine the corrected digital data signal 134.

At block 506, the nonlinearity correction circuitry 104 determines an estimate of input signal level. For example, the signal level determination circuitry 208 can determine a range of amplitudes, an envelope, etc., of the corrected digital data signal 134 (such as portion(s) of the corrected digital data signal 134 captured by the data capture circuitry 202). In some examples, the signal level determination circuitry 208 can calculate a as described above (such as in the example of Equation (6) above).

In response to determining the estimate of input signal level at block 506, control proceeds to blocks 508 and 516. For example, at block 508, the nonlinearity correction circuitry 104 determines terms of the nonlinearity function based on the type of the nonlinearity function. For example, the nonlinearity function term generation circuitry 206 can generate one or more nonlinearity function terms of the sinusoid function in response to a determination that the one or more nonlinearity function terms are for the sinusoid function.

At block 510, the nonlinearity correction circuitry 104 converts the digital frequency data and the terms from the time domain to the frequency domain. For example, the time-to-frequency conversion circuitry 210 can convert the linear term of the corrected digital data signal 134 from a time-domain representation to a frequency-domain representation using an FFT. The time-to-frequency conversion circuitry 210 can convert the nonlinearity function term(s) generated by the nonlinearity function term generation circuitry 206 from a time-domain representation to a frequency-domain representation via one or more FFT operations.

At block 512, the nonlinearity correction circuitry 104 selects valid frequency bins for nonlinearity function coefficient estimation. In some examples, the frequency bin identification circuitry 212 can select frequency bins associated with all nonlinearity function terms based on nonlinearity term power and signal term power criteria. For example, the frequency bin identification circuitry 212 can select one or more first frequency bins associated with a first nonlinearity function term, one or more second frequency bins associated with a second nonlinearity function term, etc., and/or any combination(s) thereof. An example process that may be performed using machine readable instructions that can be executed and/or hardware configured to implement block 512 is described below in connection with FIG. 6.

At block 514, the nonlinearity correction circuitry 104 generates nonlinearity function coefficients. For example, the coefficient determination circuitry 214 can execute a multi-state Kalman filter using the frequency-domain data of the corrected digital data signal 134 and frequency domain data of all of the selected nonlinearity function terms in the selected valid frequency bins. In some examples, the coefficient determination circuitry 214 can execute the multi-state Kalman filter to output one or more nonlinearity function coefficients to the nonlinearity curve generation circuitry 140.

At block 516, the nonlinearity correction circuitry 104 generates a nonlinearity curve based on the nonlinearity function coefficients and the estimate of the input signal level. For example, the nonlinearity curve generation circuitry 140 can generate a curve, such as an INL curve, based on the nonlinearity function terms of the sinusoid function and the nonlinearity function coefficients from the coefficient determination circuitry 214.

At block 518, the nonlinearity correction circuitry 104 updates nonlinearity curve data stored in a look-up table with data from the generated nonlinearity curve. For example, the nonlinearity curve generation circuitry 140 can determine updates or revisions to correction terms in the correction look-up table 142 based on the generated nonlinearity curve.

At block 520, the nonlinearity correction circuitry 104 generates nonlinearity corrected data based on the updated look-up table. For example, the correction look-up table 142 can map the digital data signal 130 from the ADC 120 to correction term(s) in the correction look-up table 142. The correction look-up table 142 can output the correction term(s) to the adder circuitry 122. The adder circuitry 122 can apply the correction term(s) to the digital data signal 130 to generate nonlinearity corrected data, such as the corrected digital data signal 134. The adder circuitry 122 can output the corrected digital data signal 134 to the DSP 114 for further processing.

At block 522, the nonlinearity correction circuitry 104 determines whether to continue estimating the nonlinearity function coefficients. If, at block 522, the nonlinearity correction circuitry 104 determines to continue estimating the nonlinearity function coefficients, control returns to block 502, otherwise the process 500 of FIG. 5 concludes.

FIG. 6 is a flowchart representative of an example process 600 that may be performed using machine readable instructions that can be executed and/or hardware configured to implement the blind nonlinearity estimation circuitry 138 of FIGS. 1 and/or 2, and/or, more generally, the nonlinearity correction circuitry 104 of FIG. 1, and/or, more generally, the system 100 of FIG. 1, to select valid frequency bins for nonlinearity function coefficient estimation. In some examples, the process 600 of FIG. 6 can implement block 512 of FIG. 5. The process 600 of FIG. 6 begins at block 602, at which the nonlinearity correction circuitry 104 selects a frequency bin to process. For example, the signal power comparator 306 and/or the nonlinearity function term power comparator 308 can select a first frequency bin (such as frequency bin 0) to process.

At block 604, the nonlinearity correction circuitry 104 determines a signal power using a fast Fourier transform (FFT) response at the frequency bin. For example, the signal power determination circuitry 302 can determine a signal power of the linear term at the first frequency bin.

At block 606, the nonlinearity correction circuitry 104 determines a nonlinearity function term power using the FFT response at the frequency bin. For example, the nonlinearity function term power determination circuitry 304 can determine a nonlinearity function term power for each of the nonlinearity function terms at the frequency bin.

At block 608, the nonlinearity correction circuitry 104 compares the signal power to a signal power threshold. For example, the signal power comparator 306 can compare the signal power of the linear term to a signal power threshold (such as SigThresh as identified above in Equation (16)).

At block 610, the nonlinearity correction circuitry 104 compares a nonlinearity function power to a nonlinearity power threshold. For example, the nonlinearity function term power comparator 308 can compare a sum of nonlinearity function term powers of the first nonlinearity function term, the second nonlinearity function term, etc., to a nonlinearity function term power threshold (such as NLThresh identified above in Equation (16)). In some examples, the nonlinearity function term power comparator 308 can compare a nonlinearity power of respective ones of the one or more nonlinearity function terms to the nonlinearity function term power threshold.

At block 612, the nonlinearity correction circuitry 104 determines whether the signal power is less than the signal power threshold and the nonlinearity function term power is greater than the nonlinearity function term power threshold. For example, the decision circuitry 310 can determine that the signal power is less than the signal power threshold and the sum of the nonlinearity function term powers is greater than the nonlinearity function term power threshold.

If, at block 612, the nonlinearity correction circuitry 104 determines that the signal power is not less than the signal power threshold and/or the nonlinearity function term power is not greater than the nonlinearity function term power threshold, control proceeds to block 616. If, at block 612, the nonlinearity correction circuitry 104 determines that the signal power is less than the signal power threshold and the nonlinearity function term power is greater than the nonlinearity function term power threshold, then, at block 614, the nonlinearity correction circuitry 104 selects the frequency bin to be applied in nonlinearity function coefficient estimation. For example, the decision circuitry 310 can output an indication to the coefficient determination circuitry 214 to select the first frequency bin for nonlinearity function coefficient estimation.

At block 616, the nonlinearity correction circuitry 104 determines whether all frequency bins are processed. For example, the signal power comparator 306 and/or the nonlinearity function term power comparator 308 can determine to process a second frequency bin to process if not all frequency bins have been processed.

If, at block 616, the nonlinearity correction circuitry 104 determines that not all frequency bins are processed, control returns to block 602 to select another frequency bin to process. If, at block 616, the nonlinearity correction circuitry 104 determines that all frequency bins are processed, the process 600 of FIG. 6 concludes. For example, the process 600 of FIG. 6 can return to block 514 of the process 500 of FIG. 5 to generate nonlinearity function coefficients.

Figure 7:
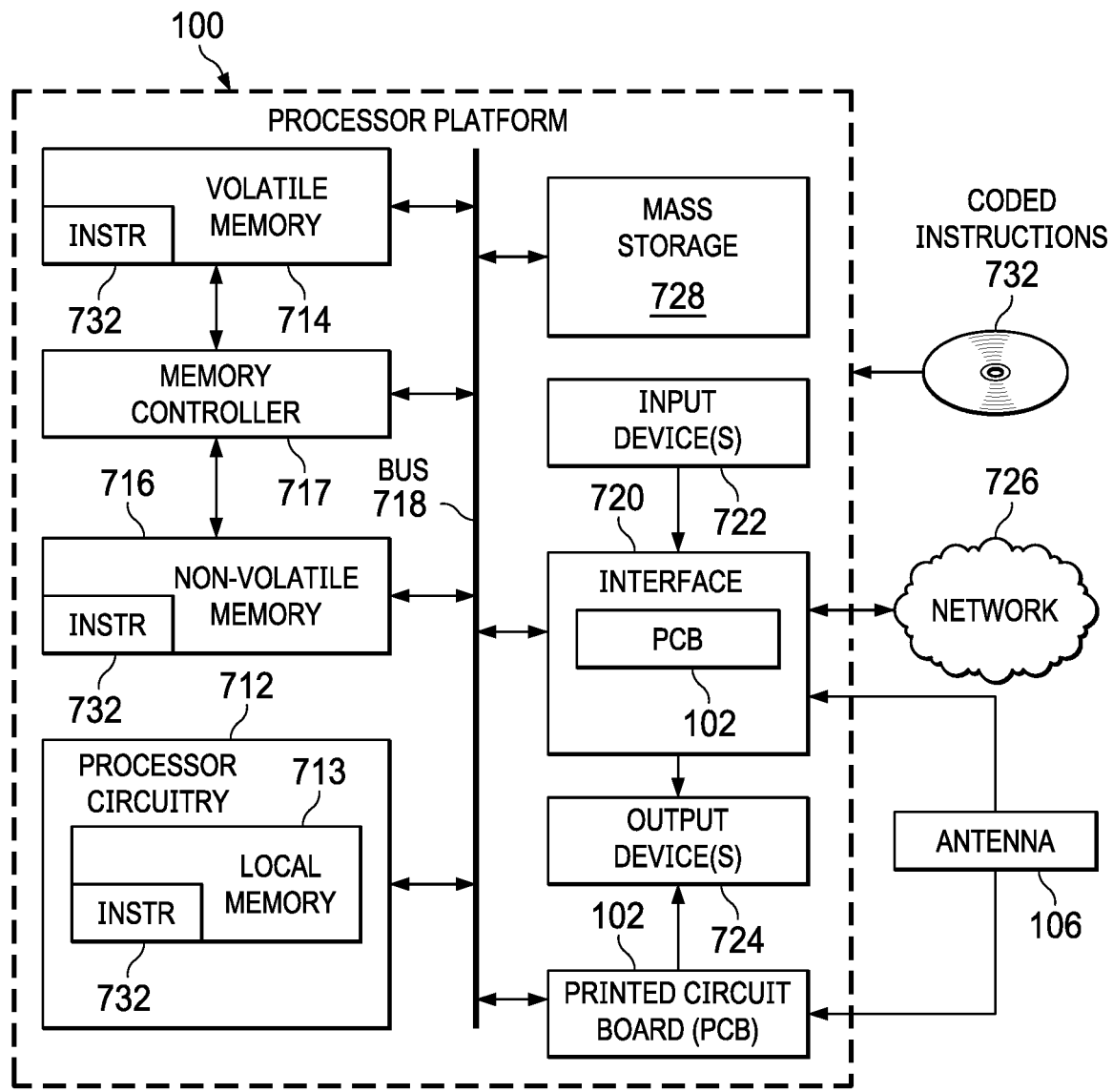
FIG. 7 is a block diagram of an example implementation of the system of FIG. 1, which includes processor circuitry structured to execute the example machine readable instructions and/or the example operations of FIGS. 5-6 to implement the printed circuit board of FIG. 1.

FIG. 7 is a block diagram of an example implementation of the system 100 of FIG. 1. In this example, the system 100 is structured to execute and/or instantiate the machine readable instructions and/or the operations of FIGS. 5-6 to implement the PCB 102 of FIG. 1. In this example, the system 100 can be, for example, a television, a projector, a personal computer, a workstation, a mobile device (such as a cell phone, a smart phone, a tablet such as an iPad™) a personal digital assistant (PDA), an Internet appliance, a headset (such as an augmented reality (AR) headset, a virtual reality (VR) headset, etc.) or other wearable device, or any other type of computing device.

The system 100 of the illustrated example includes processor circuitry 712. The processor circuitry 712 of the illustrated example is hardware. For example, the processor circuitry 712 can be implemented by one or more integrated circuits, logic circuits, FPGAs microprocessors, CPUs, GPUs, DSPs, and/or microcontrollers from any desired family or manufacturer. The processor circuitry 712 may be implemented by one or more semiconductor based (such as silicon based) devices.

The processor circuitry 712 of the illustrated example includes a local memory 713 (such as a cache, registers, etc.). The processor circuitry 712 of the illustrated example is in communication with a main memory including a volatile memory 714 and a non-volatile memory 716 by a bus 718. The volatile memory 714 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 716 may be implemented by flash memory and/or any other desired type of memory device. Access to the main memory 714, 716 of the illustrated example is controlled by a memory controller 717.

The system 100 of the illustrated example also includes interface circuitry 720. The interface circuitry 720 may be implemented by hardware in accordance with any type of interface standard, such as Ethernet, DVI, VGA, HDMI®, DisplayPort, USB, Bluetooth®, near field communication (NFC), Peripheral Component Interconnect (PCI), and/or Peripheral Component Interconnect Express (PCIe). In some examples, the interface circuitry 720 can implement one or more display interfaces (such as a display device interface). In this example, the interface circuitry 720 implements the PCB 102 of FIG. 1.

In the illustrated example, one or more input devices 722 are connected to the interface circuitry 720. The input device(s) 722 permit(s) a user to enter data and/or commands into the processor circuitry 712. The input device(s) 722 can be implemented by, for example, an audio sensor, an infrared sensor, a microphone, a camera (still or video), a keyboard, a button, a mouse, a touchscreen, a track-pad, a trackball, an isopoint device, and/or a voice recognition system.

One or more output devices 724 are also connected to the interface circuitry 720 of the illustrated example. The output device(s) 724 can be implemented, for example, by display devices (such as a light-emitting diode (LED), an organic light-emitting diode (OLED), a liquid crystal display (LCD), a cathode ray tube (CRT) display, an in-place switching (IPS) display, a touchscreen, etc.), a tactile output device, a printer, and/or speaker. The interface circuitry 720 of the illustrated example, thus, typically includes a graphics driver card, a graphics driver chip, and/or graphics processor circuitry such as a graphics processing unit (GPU).

The interface circuitry 720 of the illustrated example also includes a communication device such as a connector (such as a cable connector), a transmitter, a receiver, a transceiver, a modem, a residential gateway, a wireless access point, and/or a network interface to facilitate exchange of data with external machines (such as computing devices of any kind) by a network 726. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The system 100 of the illustrated example also includes one or more mass storage devices 728 to store software and/or data. Examples of such mass storage devices 728 include magnetic storage devices, optical storage devices, floppy disk drives, HDDs, compact discs (CDs), Blu-ray disk drives, redundant array of independent disks (RAID) systems, solid state storage devices such as flash memory devices and/or SSDs, and digital versatile disk (DVD) drives.

The machine executable instructions 732, which may be implemented by the machine readable instructions of FIGS. 5-6, may be stored in the mass storage device 728, in the volatile memory 714, in the non-volatile memory 716, and/or on a removable non-transitory computer readable storage medium such as a CD or DVD.

In the illustrated example, another instance of the PCB 102 is coupled to the bus 718 and the output device(s) 724. Alternatively, the system 100 may not include the additional instance of the PCB 102. In this example, the antenna 106 of FIG. 1 is coupled to the interface circuitry 720 and the additional instance of the PCB 102. Alternatively, the system 100 may not be coupled to the antenna 106.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus, and articles of manufacture described herein improve performance of ADCs (such as RF-ADCs) by utilizing blind online estimation and correction of ADC residual nonlinearity using received ADC data. For example, adaptive estimation of the ADC residual nonlinearity can be performed using the received ADC data to track its variations over time.

Example methods, apparatus, and articles of manufacture described herein improve performance of ADCs by utilizing frequency domain estimation of ADC nonlinearity function coefficients. Example methods, apparatus, and articles of manufacture described herein can capture ADC data in periodic chunks; create ADC nonlinearity function terms using the captured ADC data; convert the captured ADC data and nonlinearity function terms from the time domain to the frequency domain; identify frequency bins for estimation based on power of the captured ADC data and the nonlinearity function terms; and estimate ADC nonlinearity function coefficients using the identified frequency bins. Example methods, apparatus, and articles of manufacture described herein utilize various types of functions for ADC nonlinearity estimation such as sinusoid functions, a cosinusoid function, periodic triangular pulse functions, and periodic rectangular pulse functions. Example methods, apparatus, and articles of manufacture described herein dynamically estimate an input signal level for improved accuracy of estimating ADC nonlinearity curves.

Various forms of the term "couple" are used throughout the specification. These terms may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "configured to" describes the structural and functional characteristics of one or more tangible non-transitory components. For example, a device that is "configured to" perform a function mean that the device has a particular configuration that is designed or dedicated for performing a certain function. A device is "configured to" perform a certain function if such a device includes tangible non-transitory components that can be enabled, activated, or powered to perform that certain function. While the term "configured to" may encompass being configurable, this term is not limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. All such modifications and alterations are fully supported by the disclosure and is limited only by the scope of the following claims. In particular regard to the various functions performed by the above-described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in an example particular order, this does not require that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above does not require such separation in all embodiments.

Descriptors "first," "second," "third," etc., are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device, other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the discussion above suggests that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means +/− 10 percent of the stated value. Modifications are possible in the described examples, and other examples are possible within the scope of the claims.

Modifications are possible in the described embodiments, and other embodiments are possible, within the scope of the claims.

What is claimed is:

1. An apparatus for nonlinearity correction, the apparatus comprising:
    nonlinearity function selection circuitry with an output, the nonlinearity function selection circuitry to select a type of a nonlinearity function;
    nonlinearity function term generation circuitry with a first input coupled to the output of the nonlinearity function selection circuitry to generate one or more nonlinearity function terms of the nonlinearity function; and
    coefficient determination circuitry with a second input coupled to the output, the coefficient determination circuitry to determine one or more nonlinearity function coefficients;
    wherein the output is a first output, the nonlinearity function term generation circuitry has a second output, and further including time-to-frequency conversion circuitry with a third input coupled to the second output, the time-to-frequency conversion circuitry to convert the data and the one or more nonlinearity function terms from a time domain representation to a frequency domain representation.

2. The apparatus of claim 1, wherein the time-to-frequency conversion circuitry has a third output, and further including:
    frequency bin identification circuitry to select one or more frequency bins based on at least one of (i) a signal power of a signal associated with the data satisfying a signal power threshold or (ii) a nonlinearity power of respective ones of the one or more nonlinearity function terms satisfying a nonlinearity function term power threshold, the one or more frequency bins associated with at least one of the data or the one or more nonlinearity function terms.

3. An apparatus for nonlinearity correction, the apparatus comprising:
    nonlinearity function selection circuitry with an output, the nonlinearity function selection circuitry to select a type of a nonlinearity function;
    nonlinearity function term generation circuitry with a first input coupled to the output of the nonlinearity function selection circuitry to generate one or more nonlinearity function terms of the nonlinearity function; and coefficient determination circuitry with a second input coupled to the output, the coefficient determination circuitry to determine one or more nonlinearity function coefficients;

wherein the output is a first output, the coefficient determination circuitry has a third input, and further including:

frequency bin identification circuitry with a second output coupled to the third input, the frequency bin identification circuitry to select one or more frequency bins associated with at least one of the data or the one or more nonlinearity function terms; and the coefficient determination circuitry to determine the one or more nonlinearity function coefficients associated with the one or more frequency bins.

4. An apparatus for nonlinearity correction, the apparatus comprising:

control circuitry with an output, the control circuitry to generate a command that is representative of a type of a nonlinearity function to model nonlinearity portions of data output from an analog-to-digital converter; and blind nonlinearity estimation circuitry with an input coupled to the output, the blind nonlinearity estimation circuitry to:

select a type of the nonlinearity function based on the command;

generate one or more nonlinearity function terms of the nonlinearity function based on the nonlinearity portions of the data; and determine one or more nonlinearity function coefficients based on the one or more nonlinearity function terms, the nonlinearity portions of the data to be reduced based on the one or more nonlinearity function coefficients.

5. The apparatus of claim 4, wherein the type is a first type of the nonlinearity function that exhibits odd symmetry or a second type of the nonlinearity function that exhibits even symmetry, the nonlinearity function one of a sinusoid function, a cosinusoid function, a periodic rectangular pulse function, or a periodic triangular pulse function.

6. The apparatus of claim 4, wherein the command is a first command that is representative of a first type of the nonlinearity function, the first command generated at a first time, the first type is representative of the nonlinearity function having odd symmetry, the one or more nonlinearity function terms are one or more first nonlinearity function terms, and wherein:

the control circuitry to generate a second command at a second time after the first time, the second command is representative of a second type of the nonlinearity function, the second type is representative of the nonlinearity function having even symmetry; and the blind nonlinearity estimation circuitry to generate one or more second nonlinearity function terms of the nonlinearity function having the second type based on the second command.

7. The apparatus of claim 4, wherein the blind nonlinearity estimation circuitry is to:

receive the data from the analog-to-digital converter;

determine an amplitude of a signal that corresponds to the data; and determine an input signal level of the signal based on the amplitude.

8. The apparatus of claim 4, wherein the input is a first input, the output is a first output, the blind nonlinearity estimation circuitry has a second output, the one or more nonlinearity function terms are one or more first nonlinearity function terms, the one or more nonlinearity function coefficients are one or more first nonlinearity function coefficients, and further including:

nonlinearity curve generation circuitry with a second input and a third output, the second input coupled to the second output, the nonlinearity curve generation circuitry to:

generate a nonlinearity curve based on the one or more first nonlinearity function coefficients;

generate one or more second nonlinearity function terms based on the nonlinearity curve; and generate one or more correction terms based on the one or more second nonlinearity function terms; and a correction look-up table with a third input coupled to the third output, the correction look-up table to store the one or more correction terms.

9. The apparatus of claim 4, further including:

the blind nonlinearity estimation circuitry is to determine an input signal level of a signal that corresponds to the data; and nonlinearity curve generation circuitry to identify a subset of the one or more nonlinearity function terms based on the input signal level and the one or more nonlinearity function coefficients.

10. An apparatus for nonlinearity correction, the apparatus comprising:

an analog-to-digital converter (ADC) operable to output data at an output; and nonlinearity correction circuitry with an input coupled to the output, the nonlinearity correction circuitry to:

select a type of a nonlinearity function to model nonlinearity portions of the data;

generate one or more nonlinearity function terms of the nonlinearity function based on the type of the nonlinearity function;

determine one or more nonlinearity function coefficients based on the one or more nonlinearity function terms; and adjust the data with one or more correction terms, the one or more correction terms based on the one or more nonlinearity function coefficients.

11. The apparatus of claim 10, wherein the data is first data, the input is a first input, the output is a first output, the nonlinearity correction circuitry has a second output, and further including adder circuitry with a second input and a third input, the second input coupled to the output, the third input coupled to the second output, and the adder circuitry is to:

receive the first data from the ADC;

receive the one or more correction terms from the nonlinearity correction circuitry; and generate second data based on the first data and the one or more correction terms, the second data is representative of a corrected digital signal.

12. The apparatus of claim 11, wherein the output is a first output, the adder circuitry has a second output, and the second output is configured to be coupled to a digital signal processor.

13. The apparatus of claim 10, wherein the type is a first type of the nonlinearity function that exhibits odd symmetry or a second type of the nonlinearity function that exhibits even symmetry, the nonlinearity function one of a sinusoid function, a cosinusoid function, a periodic rectangular pulse function, or a periodic triangular pulse function.

14. The apparatus of claim 10, wherein the data is first data, and the nonlinearity correction circuitry is to:
- receive the first data from the ADC, the first data corresponding to an uncorrected digital signal;
- receive second data based on the first data, the second data corresponding to a corrected digital signal;
- determine an input signal level of the corrected digital signal; and
- generate a number of the one or more nonlinearity function terms based on the input signal level.

15. The apparatus of claim 10, wherein the input is a first input, the output is a first output, the ADC has a second input, and further including a digital step attenuator with a third input and a second output, the second output coupled to the second input, and the third input configured to be coupled to an amplifier.

16. The apparatus of claim 10, wherein the input is a first input, the output is a first output, the ADC has a second input, and further including:
- a digital step attenuator with a third input and a second output, the second output coupled to the second input;
- an amplifier with a fourth input and a third output, the third output coupled to the third input; and
- a filter with a fifth input and a fourth output, the fourth output coupled to the fourth input, the fifth input configured to be coupled to an antenna.

\* \* \* \* \*